(12) United States Patent
Cho et al.

(10) Patent No.: US 11,195,471 B2
(45) Date of Patent: Dec. 7, 2021

(54) LIGHT EMITTING DISPLAY PANEL

(71) Applicant: LG Display Co., Ltd., Seoul (KR)

(72) Inventors: Eunil Cho, Paju-si (KR); Sul Lee, Paju-si (KR); JeongHyeon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/082,840

(22) Filed: Oct. 28, 2020

(65) Prior Publication Data

US 2021/0142734 A1 May 13, 2021

(30) Foreign Application Priority Data

Nov. 12, 2019 (KR) .......................... 10-2019-0144210

(51) Int. Cl.
*G09G 3/3258* (2016.01)
*G09G 3/3266* (2016.01)
*G09G 3/3275* (2016.01)

(52) U.S. Cl.
CPC ......... *G09G 3/3266* (2013.01); *G09G 3/3258* (2013.01); *G09G 3/3275* (2013.01); *G09G 2300/0426* (2013.01)

(58) Field of Classification Search
None
See application file for complete search history.

(56) References Cited

U.S. PATENT DOCUMENTS

| | | | |
|---|---|---|---|
| 10,700,098 B2* | 6/2020 | Takahashi | ........... H01L 27/1262 |
| 2019/0096323 A1 | 3/2019 | Lee et al. | |
| 2019/0319080 A1 | 10/2019 | Ke et al. | |
| 2020/0365677 A1* | 11/2020 | Yun | ...................... G09G 3/3266 |

FOREIGN PATENT DOCUMENTS

| | | |
|---|---|---|
| EP | 3211671 A1 | 8/2017 |
| WO | 2019/196410 A1 | 10/2019 |

* cited by examiner

*Primary Examiner* — Duane N Taylor, Jr.
(74) *Attorney, Agent, or Firm* — Seed IP Law Group LLP

(57) ABSTRACT

A display device is provided. The display device includes a light emitting display panel. The display panel includes a plurality of pixels. Each of the pixels include a first, second, third, and fourth pixel circuit layers and a light emitting device layer. Each of the layers are sequentially mounted on each other from the first pixel circuit layer to the light emitting device layer. The first pixel circuit layer includes a first pixel circuit configuring a pixel driving circuit. The second pixel circuit layer includes a second pixel circuit configuring the pixel driving circuit. The third pixel circuit layer includes a third pixel circuit configuring the pixel driving circuit. The fourth pixel circuit layer includes a fourth pixel circuit configuring the pixel driving circuit. The light emitting device layer includes a light emitting device electrically connected to the fourth pixel circuit.

20 Claims, 17 Drawing Sheets

PC2

LIGHT EMITTING DISPLAY PANEL

CROSS-REFERENCE TO RELATED APPLICATIONS

This application claims the benefit of the Korean Patent Application No. 10-2019-0144210 filed Nov. 12, 2019, which is hereby incorporated by reference as if fully set forth herein.

BACKGROUND

Technical Field

The present disclosure relates to a light emitting display panel.

Description of the Related Art

Since light emitting display apparatuses display an image by using a self-emitting device, the light emitting display apparatuses have a fast response time, low power consumption, and a good viewing angle, and thus, are attracting much attention as next-generation display apparatuses.

Each of a plurality of pixels of a light emitting display panel configuring a light emitting display apparatus includes a pixel driving circuit. The pixel driving circuit controls a level of a current flowing from a driving power source to a light emitting device on the basis of switching of a driving transistor based on a data voltage, thereby allowing the light emitting device to emit light. Therefore, the light emitting display apparatus displays a certain image.

In the light emitting display panel, a current flowing in the light emitting device of each pixel may vary based on a deviation of a threshold voltage of the driving transistor caused by a process deviation. Therefore, even when the same data voltages are supplied to pixel driving circuits of the light emitting display panel, a current output from the driving transistor may vary for each pixel, and due to this, uniform image quality may not be realized. Therefore, an internal compensation circuit for compensating for the threshold voltage of the driving transistor is included in the each of the pixel driving circuits.

Recently, a light emitting display panel applied to mobile electronic devices, virtual image display apparatuses, or head-mounted display apparatuses is progressively increasing in resolution. As a resolution of a light emitting display panel increases progressively, a size of each pixel is progressively reduced. Therefore, it is difficult to form (or place) a pixel driving circuit, including an internal compensation circuit, in a pixel, and due to this, it is difficult to manufacture a high-resolution light emitting display panel.

BRIEF SUMMARY

Accordingly, the present disclosure is directed to providing a light emitting display panel that substantially obviates one or more problems due to limitations and disadvantages of the related art.

An aspect of the present disclosure is directed to providing a light emitting display panel in which a plurality of transistors configuring a pixel driving circuit are divisionally disposed at different layers.

Additional benefits and features of the disclosure will be set forth in part in the description which follows and in part will become apparent to those having ordinary skill in the art upon examination of the following or may be learned from practice of the disclosure. The advantages of the disclosure may be realized and attained by the structure particularly pointed out in the written description and claims hereof as well as the appended drawings.

To achieve these and other technical benefits and in accordance with the purpose of the disclosure, as embodied and broadly described herein, there is provided a light emitting display panel including a plurality of pixels, wherein each of the plurality of pixels includes a first pixel circuit layer including a first pixel circuit configuring a pixel driving circuit, a second pixel circuit layer provided on the first pixel circuit layer, the second pixel circuit layer including a second pixel circuit configuring the pixel driving circuit, a third pixel circuit layer provided on the second pixel circuit layer, the third pixel circuit layer including a third pixel circuit configuring the pixel driving circuit, a fourth pixel circuit layer provided on the third pixel circuit layer, the fourth pixel circuit layer including a fourth pixel circuit configuring the pixel driving circuit, and a light emitting device layer provided on the fourth pixel circuit layer, the light emitting device layer including a light emitting device electrically connected to the fourth pixel circuit. A driving transistor for controlling the amount of current flowing to the light emitting device is included in the first pixel circuit layer, and a capacitor for storing a threshold voltage of the driving transistor is included in the third pixel circuit layer.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
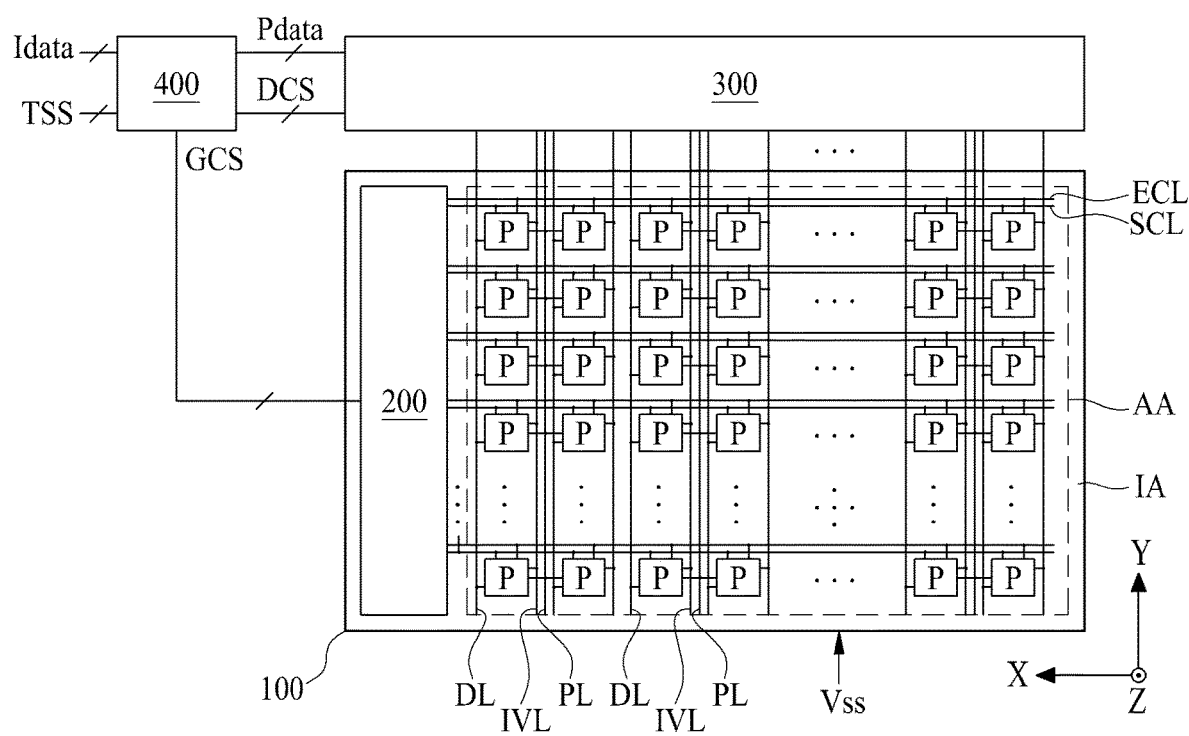
FIG. 1 is a diagram schematically illustrating a light emitting display apparatus to which a light emitting display panel according to an embodiment of the present disclosure is applied.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a diagram schematically illustrating a light emitting display apparatus to which a light emitting display panel according to an embodiment of the present disclosure is applied.

The light emitting display apparatus to which a light emitting display panel according to an embodiment of the present disclosure is applied, as illustrated in FIG. 1, may include a light emitting display panel 100, a gate driver 200, a data driver 300, and a timing controller 400.

The light emitting display panel 100 may include a substrate, a display area AA defined on the substrate, and a non-display area IA adjacent to the display area AA.

The substrate may be a base substrate (or a base layer) and may include a plastic material or a glass material. The substrate according to an embodiment may have a flat tetragonal shape, a tetragonal shape where each corner portion is rounded at a certain curvature radius, or a non-tetragonal shape including at least seven sides. Here, the substrate having a non-tetragonal shape may include at least one protrusion portion or at least one notch portion.

The substrate according to an embodiment may include a colored polyimide material. For example, the substrate including a polyimide material may be formed by curing a polyimide resin which is coated to have a certain thickness on a front surface of a release layer provided in a relatively thick carrier substrate. In this case, the carrier substrate may be separated from the substrate by releasing the release layer through a laser release process. The substrate according to an embodiment may further include a back plate coupled to a rear surface of the substrate with respect to a thickness direction Z. The back plate may maintain the substrate in a flat state. The back plate according to an embodiment may include a plastic material, and for example, may include polyethylene terephthalate. The back plate may be laminated on the rear surface of the substrate separated from the carrier substrate.

According to another embodiment, the substrate may be a flexible glass substrate. For example, the substrate including a glass material may be a thin glass substrate having a thickness of 100 μm or less, or may be a carrier glass substrate which has been etched to have a thickness of 100 μm or less through a substrate etching process performed after a manufacturing process is completed.

A plurality of initialization voltage lines IVL, a plurality of scan control lines SCL, a plurality of emission control lines ECL, a plurality of data lines DL, a plurality of pixel driving voltage lines PL, a common electrode layer, and a plurality of pixels P may be provided in the display area AA.

The plurality of initialization voltage lines IVL may extend long in a second direction Y intersecting with a first direction X and may be apart from one another in the first direction X. Here, the first direction X may be a direction parallel to a widthwise direction of the substrate and the second direction Y may be a direction parallel to a lengthwise direction of the substrate. However, the present disclosure is not limited thereto, and the first direction X may be a direction parallel to the lengthwise direction of the substrate and the second direction Y may be a direction parallel to the widthwise direction of the substrate. Each of the plurality of initialization voltage lines IVL may transfer an initialization voltage, supplied from the data driver 300 or a power supply circuit, to a corresponding pixel among the plurality of pixels.

The plurality of scan control lines SCL may extend long in the first direction X and may be respectively disposed adjacent to the plurality of emission control lines ECL. Each of the plurality of scan control lines SCL may transfer a scan control signal, supplied from the gate driver 200, to a corresponding pixel among the plurality of pixels.

The plurality of emission control lines ECL may extend long in the first direction X and may be disposed in parallel with the plurality of scan control lines SCL. Each of the plurality of emission control lines ECL may transfer an emission control signal, supplied from the gate driver 200, to a corresponding pixel among the plurality of pixels.

The plurality of data lines DL may extend long in the second direction Y and may be apart from one another in the first direction X. Each of the plurality of data lines DL may transfer a data voltage, supplied from the data driver 300, to a corresponding pixel among the plurality of pixels.

The plurality of pixel driving voltage lines PL may be respectively disposed in parallel with the plurality of data lines DL. Each of the plurality of pixel driving voltage lines PL may transfer a pixel driving voltage, supplied from the data driver 300 or the power supply circuit, to a corresponding pixel among the plurality of pixels.

Each of the plurality of pixel driving voltage lines PL according to an embodiment may be disposed to correspond to two pixels each disposed adjacent to each other in the first direction X. That is, one pixel driving voltage line PL may be disposed to be shared by two pixels disposed adjacent to each other in the first direction X.

The common electrode layer may be disposed in the whole display area AA. The common electrode layer may transfer a common voltage Vss, supplied from the data driver 300 or the power supply circuit, to the plurality of pixels. At least one common power supply line electrically connected to the common electrode layer may be provided in the display area AA.

Each of the plurality of pixels P may be disposed in a pixel area defined in the display area AA and may be electrically connected to a corresponding initialization voltage line IVL, a corresponding scan control line SCL, a corresponding emission control line ECL, a corresponding data line DL, a pixel driving voltage line PL, and the common electrode layer, which pass through the pixel area or are disposed near the pixel area.

In this case, in order to implement the light emitting display panel 100 having a high resolution, each of the scan control line SCL and the emission control line ECL may be disposed to pass through or by the pixel area, and each of the initialization voltage line IVL, the data line DL, and the pixel driving voltage line PL may be disposed at an outer portion of the pixel area. Also, two pixels disposed adjacent to each other in the first direction X may have a symmetrical structure with respect to the pixel driving voltage line PL.

The pixels P according to an embodiment may be disposed to a stripe structure in the display area AA. In this case, one unit pixel may include red pixel, a green pixel, and a blue pixel, and moreover, may further include white pixel.

According to another embodiment, the pixels P may be disposed to have a pentile structure in the display area AA. In this case, one unit pixel may include at least one red pixel, at least two green pixels, and at least one blue pixel, which are arranged to one-dimensionally have a polygonal shape. For example, one unit pixel having the pentile structure may be disposed so that one red pixel, two green pixels, and one blue pixel are arranged to one-dimensionally have an octagonal shape, and in this case, the blue pixel may include an opening area (or an emission area) having a relatively largest size and the green pixel may include an opening area having a relatively smallest size.

Each of the plurality of pixels P may operate in the order of an initialization period, a sampling period, and an emission period to emit light having luminance corresponding to a data voltage supplied through a corresponding data line DL.

In some embodiments, the non-display area IA may be provided along an edge of the substrate to surround the display area AA. One non-display region of the non-display area IA may include a pad part.

The pad part may be disposed in one non-display area of the substrate and may be electrically connected to lines disposed in the display area AA in the second direction Y. Also, the pad part may be electrically connected to the data driver 300.

The timing controller 400 may align input video data Idata on the basis of driving of the light emitting display panel 100 to generate pixel data Pdata, generate a data control signal DCS on the basis of a timing synchronization signal TSS, and provide the pixel data Pdata and the data control signal DCS to the data driver 300.

The timing controller 400 may generate a gate control signal GCS including a gate start signal and a plurality of gate shift clocks on the basis of the timing synchronization signal TSS and may provide the gate control signal GCS to the gate driver 200. The gate control signal GCS may be provided to the gate driver 200 via the pad part.

The data driver 300 may be connected to a plurality of data lines DL, provided in the light emitting display panel 100, via the pad part. The data driver 400 may convert the pixel data Pdata into an analog data voltage by using the data control signal DCS and a plurality of reference gamma voltages provided from the timing controller 400 and may provide a converted data voltage to a corresponding data line DL.

The gate driver 200 may generate an initialization control signal, a scan control signal, and an emission control signal respectively corresponding to the initialization period, the sampling period, and the emission period of each of a plurality of pixels P on the basis of the gate control signal GCS provided from the controller 400 and may provide the initialization control signal, the scan control signal, and the emission control signal to the plurality of pixels P.

The gate driver 200 according to an embodiment may generate emission control signals which have the same period and a sequentially-shifted phase and may supply the emission control signals to a plurality of emission control lines ECL.

The gate driver 200 according to an embodiment may be provided in a left non-display area and/or a right non-display area of a substrate through a process of manufacturing a thin film transistor (TFT) of each of the pixels P.

For example, the gate driver 200 may be provided in the left non-display area of the substrate and may supply the emission control signal to one end of each of the emission control lines ECL on the basis of a single feeding method.

As another example, the gate driver 200 may be provided in each of the left non-display area and the right non-display area of the substrate and may supply the emission control signal to both ends of each of the emission control lines ECL on the basis of a double feeding method.

Figure 2:
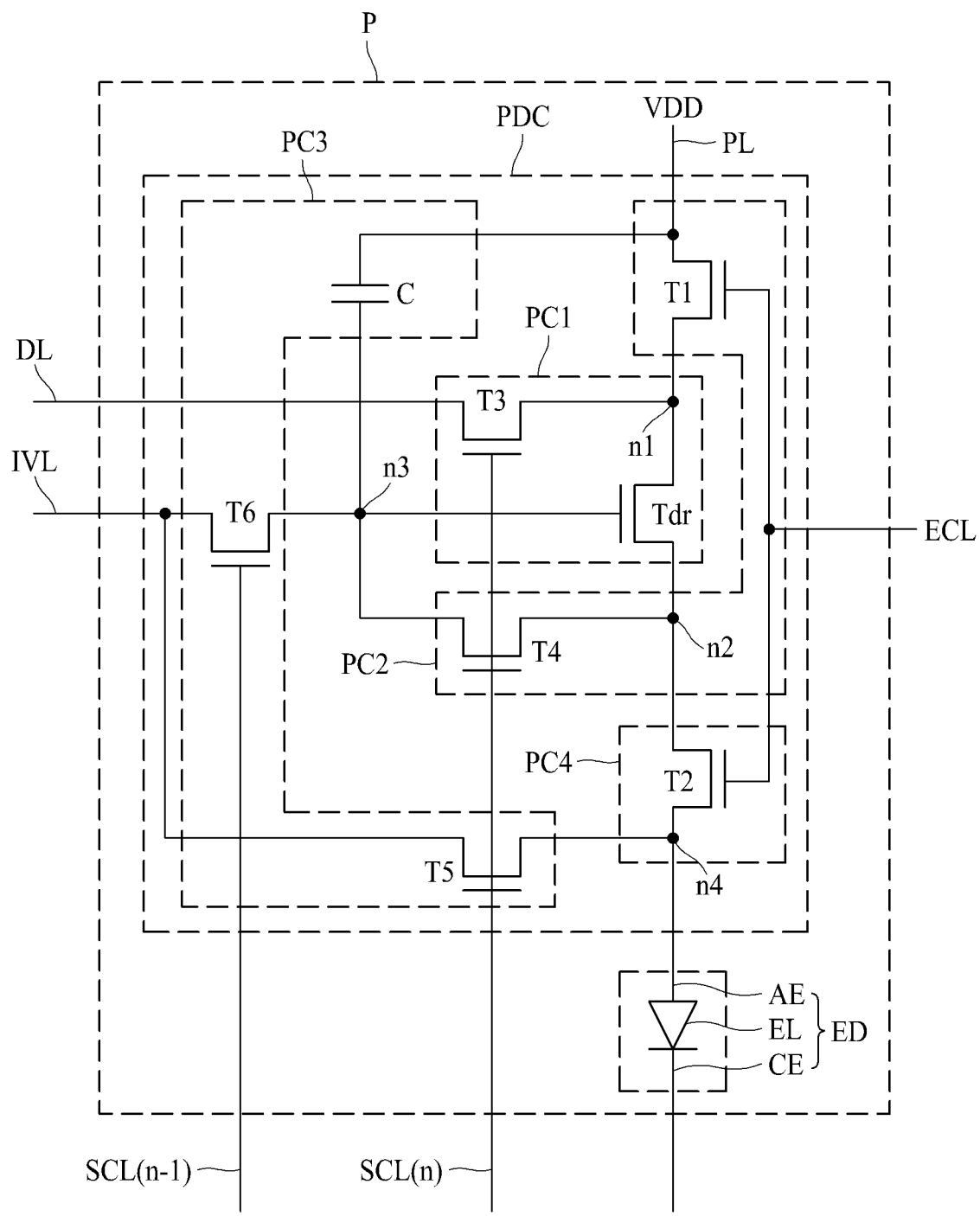
FIG. 2 is a circuit diagram of an embodiment of a pixel applied to a light emitting display panel according to the present disclosure.
Figure 3:
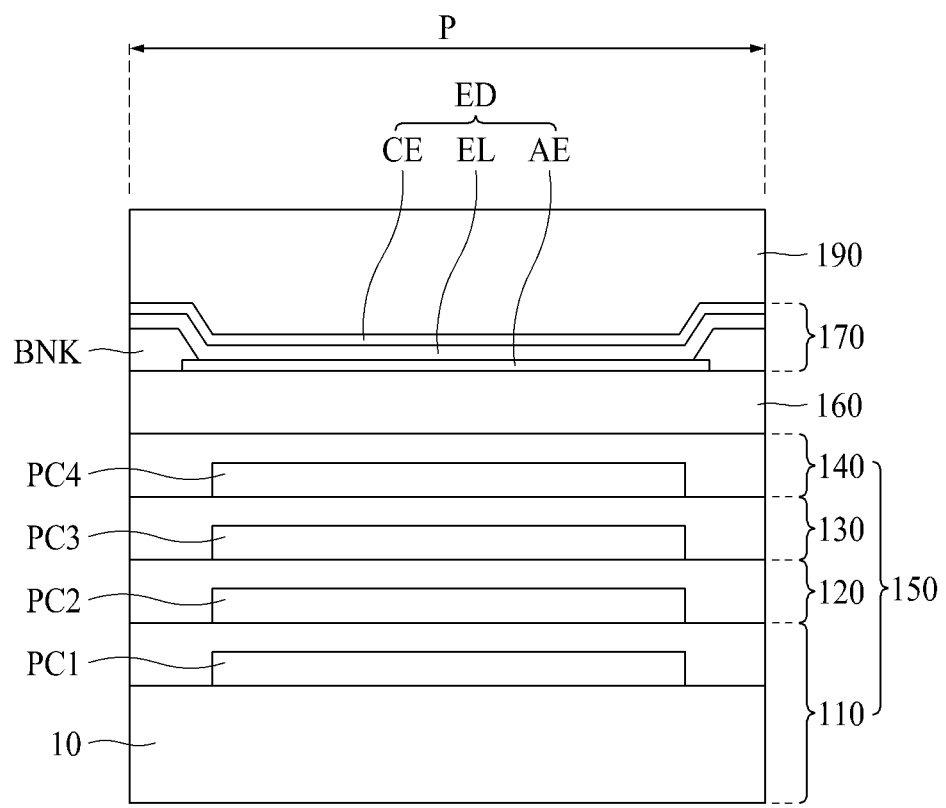
FIG. 3 is a cross-sectional view illustrating a layer structure of a pixel illustrated in FIG. 2.
Figure 4:
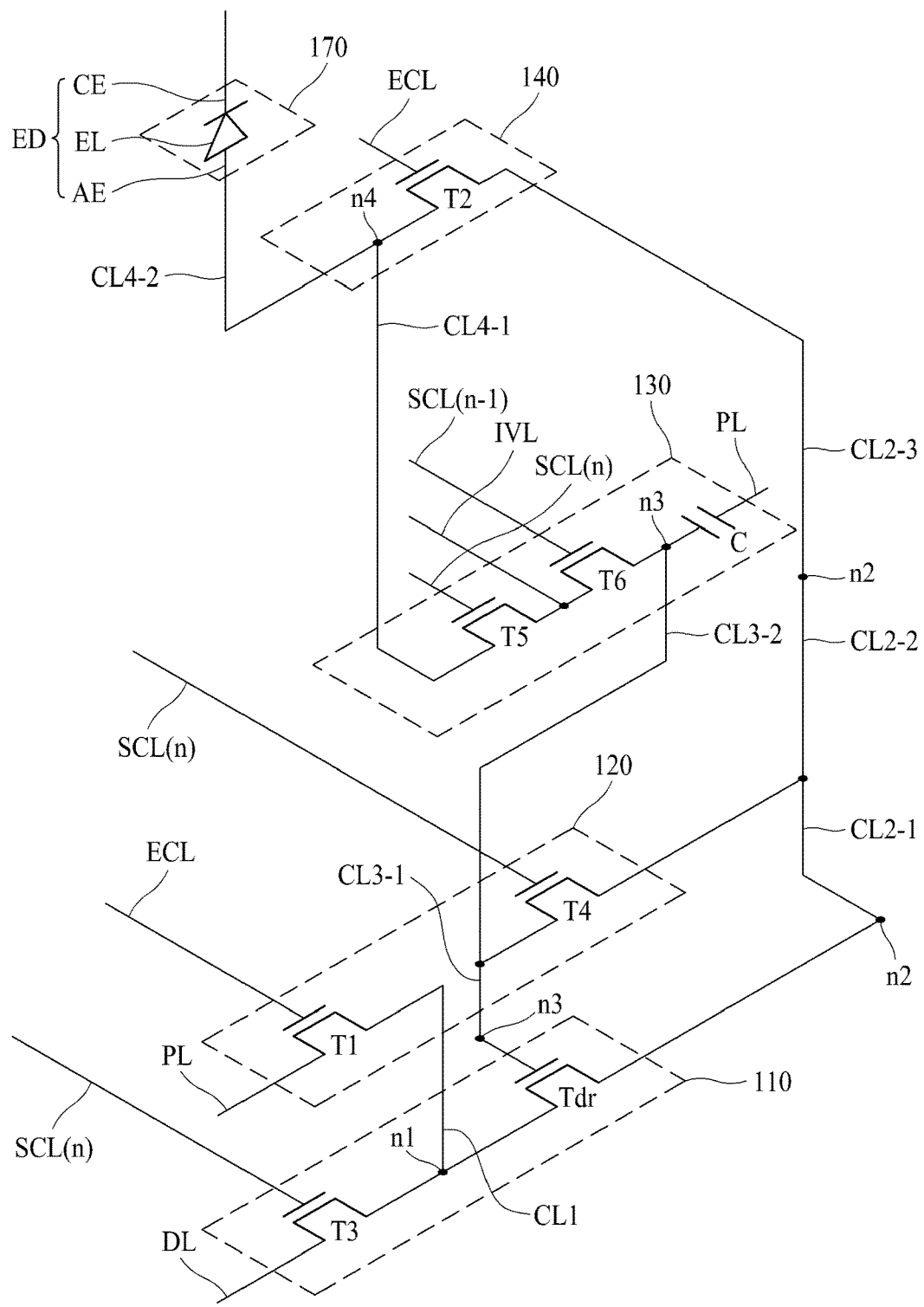
FIG. 4 is a diagram illustrating a circuit configuration of each layer illustrated in FIG. 3.

FIG. 2 is a circuit diagram of an embodiment of a pixel applied to a light emitting display panel according to the present disclosure, FIG. 3 is a cross-sectional view illustrating a layer structure of a pixel illustrated in FIG. 2, and FIG. 4 is a diagram illustrating a circuit configuration of each layer illustrated in FIG. 3.

As illustrated in FIGS. 2 to 4, a pixel P applied to the light emitting display panel according to the present disclosure may include a pixel driving circuit layer 150 including a pixel driving circuit PDC and a light emitting device layer 170 including a light emitting device ED electrically connected to the pixel driving circuit PDC.

The pixel driving circuit layer 150 may include a first pixel circuit layer 110 including a first pixel circuit PC1, a second pixel circuit layer 120 including a second pixel circuit PC2, a third pixel circuit layer 130 including a third pixel circuit PC3, and a fourth pixel circuit layer 140 including a fourth pixel circuit PC4.

First, the first pixel circuit layer 110 according to an embodiment may include a substrate 110, a first pixel circuit PC1, a data line DL for transferring a data voltage to the first pixel circuit PC1, and an $n^{th}$ scan control line SCL(n) for transferring an $n^{th}$ scan control signal to the first pixel circuit PC1.

The substrate 10, as described above, may include a plastic material or a glass material.

The data line DL may be disposed at one edge of the pixel P in parallel with a second direction Y. The data line DL according to an embodiment may be disposed at one edge of the pixel P to overlap with or not to overlap with the $n^{th}$ scan control line SCL(n) disposed in the first pixel circuit layer 110 one-dimensionally. For example, the data line DL may be disposed at the one edge of the pixel P to overlap with the $n^{th}$ scan control line SCL(n) disposed in the first pixel circuit layer 110.

The $n^{th}$ scan control line SCL(n) may be disposed in the pixel P and may be apart from and parallel to the emission control line ECL. The $n^{th}$ scan control line SCL(n) according to an embodiment may be disposed in the pixel P to overlap with or not to overlap with an emission control line ECL disposed in the second pixel circuit layer 120 one-dimensionally.

The first pixel circuit PC1 may control the amount of current flowing to the light emitting device ED by using the data voltage supplied through the data line DL.

The first pixel circuit PC1 according to an embodiment may include a third transistor T3, including a gate connected to the $n^{th}$ scan control line SCL(n) and a first terminal connected to the data line DL, and a driving transistor Tdr which includes a first terminal connected to a second terminal of the third transistor T3.

The third transistor T3 may be turned on or off based on an $n^{th}$ scan control signal supplied through the $n^{th}$ scan control line SCL(n). When the third transistor T3 is turned on, the data voltage supplied through the data line DL may be charged into a capacitor C.

The third transistor T3 according to an embodiment may include a gate connected to the $n^{th}$ scan control line SCL(n), a second terminal connected to the first terminal of the driving transistor Tdr through a first node n1, and a first terminal connected to the data line DL. In the following description, in a case where gates of first to sixth transistors T1 to T6 should be distinguished from one another, the gates may be referred to as first to sixth gate electrodes. Also, the gate of the driving transistor Tdr may be referred to as a driving gate electrode. However, in a case where it is not needed to distinguish the gates, each of the gates of the first to sixth transistors T1 to T6 may be simply referred to as a gate.

The driving transistor Tdr may transfer, to the light emitting device ED, a current corresponding to a gate-source voltage based on a data voltage supplied through the data line DL.

The driving transistor Tdr according to an embodiment may include a first terminal connected to the second terminal of the third transistor T3 through the first node n1, a second terminal connected to a fourth transistor T4 included in the second pixel circuit layer 120 and a second transistor T2 included in the fourth pixel circuit layer 140, and a gate connected to a sixth transistor T6 included in the third pixel circuit layer 130 and the capacitor C.

The first terminal of the driving transistor Tdr may be a source electrode, and the second terminal thereof may be a drain electrode. The driving transistor Tdr may be turned on based on a gate-source voltage thereof, and thus, a current corresponding to the gate-source voltage based on the data voltage may flow in the first transistor T1, the driving transistor Tdr, the second transistor T2, and the light emitting device ED.

Each of the third transistor T3 and the driving transistor Tdr may include a semiconductor layer including an amorphous silicon material, a polysilicon material, or an oxide semiconductor material and may be a P-type TFT including a semiconductor layer doped with P-type impurities, but is not limited thereto and may be an N-type TFT including a semiconductor layer doped with N-type impurities. That is, in FIG. 2, a pixel driving circuit PDC including a plurality of P-type TFTs is illustrated, but the pixel driving circuit PDC may include a plurality of N-type TFTs.

The polysilicon material may be good in reliability with respect to a strong bias stress and may have high electron mobility. Therefore, each of the third transistor T3 and the driving transistor Tdr according to an embodiment may include a P-type TFT including a semiconductor layer including a polysilicon material doped with P-type impurities.

Features of materials included in the third transistor T3 and the driving transistor Tdr may be applied to all of the first transistor T1, the second transistor T2, and the fourth to sixth transistors T4 to T6.

Second, the second pixel circuit layer 120 may be disposed at a top surface (or a surface) of the first pixel circuit layer 110. The second pixel circuit layer 120 according to an embodiment may include a second pixel circuit PC2, an emission control line ECL for transferring an emission control signal to the second pixel circuit PC2, and the $n^{th}$ scan control line SCL(n) for transferring the $n^{th}$ scan control signal to the second pixel circuit PC2.

The emission control line ECL may be disposed in the pixel P in parallel with a first direction X.

The $n^{th}$ scan control line SCL(n) may be disposed in the pixel P so as to be apart from and in parallel with the emission control line ECL. Particularly, the $n^{th}$ scan control line SCL(n) included in the second pixel circuit layer 120 may be electrically connected to, through a first scan connection line, the $n^{th}$ scan control line SCL(n) included in the first pixel circuit layer 110. In this case, the first scan connection line may be provided in the display area AA, and moreover, may be provided in the non-display area IA. Also, at least one first scan connection line may be provided in only the non-display area IA, at least one first scan connection line may be provided in only the display area AA, and at least two first scan connection lines may be provided in only the display area AA and the non-display area IA.

The second pixel circuit PC2 may charge the data voltage, supplied through the data line DL, into the capacitor C.

The second pixel circuit PC2 according to an embodiment may include a first transistor T1, which includes a first terminal connected to a pixel driving voltage line PL, a second terminal connected to the second terminal of the third transistor T3 and the first terminal of the driving transistor Tdr through the first node n1, and a gate connected to an emission control line ECL, and a fourth transistor T4 which includes a gate connected to the $n^{th}$ scan control line SCL(n), a first terminal connected to the gate of the driving transistor Tdr and a second electrode of the capacitor C, and a second terminal connected to the second terminal of the driving transistor Tdr and the first terminal of the second transistor T2 through the second node n2.

The first transistor T1 may be turned on or off based on the emission control signal supplied through the emission control line ECL. When the first transistor T1 is turned on, a current may be supplied to the driving transistor Tdr.

The first transistor T1 according to an embodiment may include a gate connected to the emission control line ECL, a first terminal connected to the pixel driving voltage line PL, and a second terminal connected to the first terminal of the driving transistor Tdr. The second terminal of the first transistor T1 may be connected to the second terminal of the third transistor T3.

The fourth transistor T4 may be turned on or off based on the $n^{th}$ scan control signal supplied through the $n^{th}$ scan control line SCL(n). When the fourth transistor T4 is turned on, a data voltage supplied through the data line DL, the third transistor T3, and the driving transistor Tdr may be charged into the capacitor C.

The fourth transistor T4 according to an embodiment may include a gate connected to the $n^{th}$ scan control line SCL(n), a first terminal connected to the gate of the driving transistor Tdr, and a second terminal connected to the second terminal of the driving transistor Tdr. The first terminal of the fourth transistor T4 may be connected to the second terminal of the sixth transistor T6 and the second electrode of the capacitor C. Also, the second terminal of the fourth transistor T4 may be connected to the first terminal of the second transistor T2.

Third, the third pixel circuit layer 130 may be disposed at a top surface (or a surface) of the second pixel circuit layer 120.

The third pixel circuit layer 130 according to an embodiment may include a third pixel circuit PC3, an n–$1^{th}$ scan control line SCL(n–1) for transferring an n–$1^{th}$ scan control signal to the third pixel circuit PC3, an initialization voltage line IVL for transferring an initialization voltage to the third pixel circuit PC3, and an $n^{th}$ scan control line SCL(n) for transferring an $n^{th}$ scan control signal to the third pixel circuit PC3.

The n–$1^{th}$ scan control line SCL(n–1) may be disposed in the pixel P so as to be apart from and in parallel with the emission control line ECL and the $n^{th}$ scan control line SCL(n). The n–$1^{th}$ scan control line SCL(n–1) according to an embodiment may be disposed in the pixel P to overlap with or not to overlap with the emission control line ECL disposed in the second pixel circuit layer 120 one-dimensionally and may be disposed in the pixel P to overlap with the $n^{th}$ scan control line SCL(n) disposed in the first pixel circuit layer 110.

The initialization voltage line IVL may be disposed in the pixel P in parallel with the data line DL. The initialization voltage supplied through the initialization voltage line IVL may initialize the capacitor C, the gate of the driving transistor Tdr, and the light emitting device ED.

The $n^{th}$ scan control line SCL(n) included in the third pixel circuit layer 130 may be electrically connected to, through a second scan connection line, the $n^{th}$ scan control line SCL(n) included in the second pixel circuit layer 120. In this case, the second scan connection line may be provided in the display area AA, and moreover, may be provided in the non-display area IA. Also, at least one second scan connection line may be provided in only the non-display area IA, at least one second scan connection line may be provided in only the display area AA, and at least two second scan connection lines may be provided in only the display area AA and the non-display area IA.

The third pixel circuit PC3 may initialize the capacitor C and the gate of the driving transistor Tdr.

The third pixel circuit PC3 according to an embodiment may include a sixth transistor T6 which includes a first terminal connected to an initialization voltage line IVL, a second terminal connected to the gate of the driving transistor Tdr, and a gate connected to an n–$1^{th}$ scan control line SCL(n–1), a fifth transistor T5 which includes a gate connected to the $n^{th}$ scan control line SCL(n) and a first terminal connected to the initialization voltage line IVL, and a capacitor C which includes a first electrode connected to the pixel driving voltage line PL and a second electrode connected to the second terminal of the sixth transistor T6.

The sixth transistor T6 may be turned on or off based on an n–$1^{th}$ scan control signal supplied through the n–$1^{th}$ scan control line SCL(n–1). When the sixth transistor T6 is turned on, a third node n3 may be initialized by an initialization voltage supplied through the initialization voltage line IVL and the sixth transistor T6.

The sixth transistor T6 according to an embodiment may include a first terminal connected to the initialization voltage line IVL and the first terminal of the fifth transistor T5, a second terminal connected to the second electrode of the capacitor C, the first terminal of the fourth transistor T4, and the gate of the driving transistor Tdr, and a gate connected to the n–$1^{th}$ scan control line SLC(n–1). The first terminal of the sixth transistor T6 may be connected to the initialization voltage line IVL and the first terminal of the fifth transistor T5. The second terminal of the sixth transistor T6 may be connected to the second electrode of the capacitor C, the first terminal of the fourth transistor T4, and the gate of the driving transistor Tdr.

The fifth transistor T5 may be turned on or off based on the $n^{th}$ scan control signal supplied through the $n^{th}$ scan control line SCL(n). When the fifth transistor T5 is turned on, the light emitting device ED may be initialized by the initialization voltage supplied through the initialization voltage line IVL and the fifth transistor T5.

The fifth transistor T5 according to an embodiment may include a gate connected to the $n^{th}$ scan control line SCL(n), a first terminal connected to the initialization voltage line IVL, and a second terminal connected to the light emitting device ED. The first terminal of the fifth transistor T5 may also be connected to the first terminal of the sixth transistor T6. The second terminal of the fifth transistor T5 may be connected to the second terminal of the second transistor T2 and the light emitting device ED.

The capacitor C, as described above, may store a data voltage supplied through the data line DL. Also, the capacitor C may store the initialization voltage supplied through the initialization voltage line IVL. Also, the capacitor C may store a threshold voltage of the driving transistor Tdr. That is, the capacitor C may sense a variation of the threshold voltage of the driving transistor Tdr and may store the threshold voltage, for performing an internal compensation function of compensating for the variation of the threshold voltage.

The first electrode of the capacitor C according to an embodiment may be connected to the first terminal of the first transistor T1 and the pixel driving voltage line PL.

The second electrode of the capacitor C may be connected to the third node n3. That is, the second electrode of the capacitor C may be connected to the gate of the driving transistor Tdr, the first terminal of the fourth transistor T4, and the second terminal of the sixth transistor T6.

Fourth, the fourth pixel circuit layer 140 may be disposed at a top surface (or a surface) of the third pixel circuit layer 130.

The fourth pixel circuit layer 140 according to an embodiment may include a fourth pixel circuit PC4 and an emission control line ECL for transferring the emission control signal to the fourth pixel circuit PC4.

The emission control line ECL may be disposed in the pixel P in parallel with the first direction X.

The emission control line ECL included in the second pixel circuit layer 120 may be electrically connected to, through an emission control signal connection line, the emission control line ECL included in the fourth pixel circuit layer 140. In this case, the emission control signal connection line may be provided in the display area AA, and moreover, may be provided in the non-display area IA. Also, at least one emission control signal connection line may be provided in only the non-display area IA, at least one emission control signal connection line may be provided in only the display area AA, and at least two emission control signal connection lines may be provided in only the display area AA and the non-display area IA.

The fourth pixel circuit PC4 may perform a function of providing a current to the light emitting device ED.

The fourth pixel circuit PC4 according to an embodiment may include a second transistor T2 including a gate connected to the emission control line ECL, a first terminal connected to the second terminal of the driving transistor Tdr, and a second terminal connected to the light emitting device ED.

The second transistor T2 may be turned on or off based on the emission control signal supplied through the emission control line ECL. When the second transistor T2 is turned on, a current may be supplied to the light emitting device ED through the first transistor T1, the driving transistor Tdr, and the second transistor T2.

The second transistor T2 according to an embodiment may include a gate connected to the emission control line ECL, a first terminal connected to the second terminal of the driving transistor Tdr, and a second terminal connected to the light emitting device ED. The second terminal of the second transistor T2 may be connected to the second terminal of the fifth transistor T5.

The light emitting device layer 170 may include a light emitting device ED, which is electrically connected to the fourth pixel circuit PC4 and emits light on the basis of a current supplied from the fourth pixel circuit PC4, and a bank pattern BNK.

The light emitting device ED according to an embodiment may include a pixel driving electrode AE (referred to as an anode electrode) connected to the pixel driving circuit PDC, a light emitting layer EL formed on the pixel driving electrode AE, and a common electrode layer CE (referred to as a cathode electrode) electrically connected to the light emitting layer EL.

The pixel driving electrode AE may be disposed in an opening area of the pixel P and may be electrically connected to, through the second transistor T2, the second terminal of the driving transistor Tdr included in the first pixel circuit PC1.

The pixel driving electrode AE according to an embodiment may include a metal material which is high in reflectance. For example, the pixel driving electrode AE may be formed in a multi-layer structure such as a stacked structure (titanium/aluminum/titanium (Ti/Al/Ti)) of aluminum (Al) and titanium (Ti), a stacked structure (indium tin oxide/aluminum/indium tin oxide (ITO/Al/ITO)) of Al and indium tin oxide (ITO), an APC (silver/palladium/copper (Ag/Pd/Cu)) alloy, or a stacked structure (ITO/APC/ITO) of an APC alloy and ITO, or may include a single-layer structure including one material or an alloy material of two or more materials selected from among Ag, Al, molybdenum (Mo), gold (Au), magnesium (Mg), calcium (Ca), and barium (Ba).

An edge of the pixel driving electrode AE may be at least partially covered by the bank pattern BNK. The bank pattern BNK may be disposed in a pixel area other than an opening area of the pixel P and may at least partially cover an edge of the pixel driving electrode AE. Accordingly, the opening area of the pixel P may be defined.

The bank pattern BNK according to an embodiment may define the opening area of the pixel P as a pentile structure or a stripe structure.

The light emitting layer EL according to an embodiment may be formed in the whole display area AA of the substrate 10 to at least partially cover the pixel driving electrode AE and the bank pattern BNK.

The light emitting layer EL according to an embodiment may include two or more light emitting parts for emitting white light. For example, the light emitting layer EL according to an embodiment may include a first light emitting part and a second light emitting part, for emitting white light on the basis of a combination of first light and second light. Here, the first light emitting part may emit the first light and may include one of a blue light emitting part, a green light emitting part, a red light emitting part, a yellow light emitting part, and a yellowish green light emitting part. The second light emitting part may include a light emitting part emitting the second light having a complementary color relationship with the first light among a blue light emitting part, a green light emitting part, a red light emitting part, a yellow light emitting part, and a yellowish green light emitting part.

According to another embodiment, the light emitting layer EL may include one of a blue light emitting part, a green light emitting part, and a red light emitting part, for emitting colored light corresponding to a color set in the pixel P. For example, the light emitting layer EL according to another embodiment may include one of an organic light emitting layer, an inorganic light emitting layer, and a quantum dot light emitting layer, or may include a stacked or combination structure of an organic light emitting layer (or an inorganic light emitting layer) and a quantum dot light emitting layer.

Additionally, the light emitting device ED according to an embodiment may further include a function layer for enhancing the emission efficiency and/or lifetime of the light emitting layer EL.

The common electrode layer CE may be formed to be electrically connected to the light emitting layer EL. The common electrode layer CE may be formed in the whole display area AA of the substrate 10 and may be connected to the light emitting layer EL provided in each pixel area PA in common.

The common electrode layer CE according to an embodiment may include a transparent conductive material, transparent metal, or a semi-transmissive conductive material, which may transmit light. When the common electrode layer CE includes the semi-transmissive conductive material, the emission efficiency of light emitted from the light emitting device ED may increase based on a micro-cavity. The semi-transmissive conductive material according to an embodiment may include Mg, Ag, or an alloy of Mg and Ag. Additionally, a capping layer for adjusting a refractive index of the light emitted from the light emitting device ED to enhance the emission efficiency of the light may be further formed on the common electrode layer CE.

According to another embodiment, the light emitting layer EL may include a micro light emitting diode device implemented as an integrated circuit (IC) type. The micro light emitting diode device may include a first terminal electrically connected to the pixel driving electrode AE and a second terminal electrically connected to the common electrode layer CE.

The pixel P according to an embodiment may further include a planarization layer 160 at least partially covering the fourth pixel circuit layer 140 and an encapsulation layer 190 at least partially covering the light emitting device layer 170.

The planarization layer 160 may be disposed on the substrate 10 to at least partially cover the fourth pixel circuit layer 140 and may provide a flat surface on the fourth pixel circuit layer 140.

The light emitting device layer 170 may be disposed on the planarization layer 160. In this case, the pixel driving electrode AE of the light emitting device layer 170 may be connected to the second terminal of the second transistor T2 of the fourth pixel circuit PC4 through an electrode contact hole provided in the planarization layer 160, and the first terminal of the second transistor T2 may be electrically connected to the second terminal of the driving transistor Tdr of the first pixel circuit PC1.

The encapsulation layer 190 may be formed on the substrate 10 to at least partially surround the light emitting device layer 170. The encapsulation layer 190 may prevent oxygen or water from penetrating into the light emitting device ED.

The encapsulation layer 190 according to an embodiment may include at least one inorganic layer for preventing or minimizing the penetration of oxygen or water and an organic layer which covers particles occurring in a manufacturing process. For example, the encapsulation layer 190 may include a first inorganic layer, an organic layer on the first inorganic layer, and a second inorganic layer on the organic layer.

Additionally, the pixel P according to an embodiment of the present disclosure may further include a black matrix overlapping with the bank pattern BNK and a wavelength conversion layer disposed in the opening area.

The black matrix may be disposed on the encapsulation layer 190 to overlap with the bank pattern BNK.

The wavelength conversion layer according to an embodiment may include a color filter which is disposed on the encapsulation layer 190 overlapping with the opening area of the pixel P to transmit only a color wavelength, set in the pixel P, of white light incident from the light emitting device ED. For example, the wavelength conversion layer may transmit only a wavelength of red, green, or blue. When the light emitting layer EL of the light emitting device ED includes a light emitting layer emitting red light, green light, and blue light, the wavelength conversion layer may be omitted.

The pixel P according to an embodiment of the present disclosure may further include a barrier film and a light path control layer.

The barrier film may be attached on the encapsulation layer 190 by using an adhesive layer. The barrier film may primarily prevent the penetration of oxygen or water and may include a material which is low in water vapor transmission rate.

The light path control layer may control a path of incident light.

The light path control layer according to an embodiment may include a plurality of refractive layers. The plurality of refractive layers may have different refractive indexes. The light path control layer may have a structure where a high refractive layer and a low refractive layer are alternately stacked. The light path control layer according to an embodiment may change a path of incident light to minimize a color shift phenomenon caused by a viewing angle.

According to another embodiment, the light path control layer may be a polarization layer. The polarization layer may change external light, reflected by TFTs and/or lines provided in the pixel P, to circularly-polarized light, thereby enhancing visibility and a contrast ratio.

An operation of a pixel according to an embodiment of the present disclosure will be described below.

The pixel P according to an embodiment of the present disclosure may operate in an initialization period, a routing period, and an emission period. For example, one frame of a light emitting display apparatus to which a light emitting display panel according to an embodiment of the present disclosure is applied may include an initialization period for initializing the gate of the driving transistor Tdr, a routing period for storing a sampling voltage and a data voltage each corresponding to a characteristic value (for example, a threshold voltage) of the driving transistor Tdr, and an emission period for allowing the light emitting device ED to emit light with a current corresponding to the data voltage.

In the initialization period, a low voltage may be supplied to the n-1$^{th}$ scan control line SCL(n-1), and thus, the sixth transistor T6 may be turned on. In this case, a voltage of the third node n3 may be an initialization voltage Vinit. The third node n3 may be a portion connected to the second electrode of the capacitor C, the gate of the driving transistor Tdr, the first terminal of the fourth transistor T4, and the second terminal of the sixth transistor T6.

In the routing period, a low voltage may be supplied to the n$^{th}$ scan control line SCL(n), and thus, the third transistor T3 may be turned on. In this case, the voltage of the third node n3 may be a sum voltage of a data voltage Vdata supplied through the data line DL and a threshold voltage Vth of the driving transistor Tdr. That is, the voltage of the third node n3 may be changed from the initialization voltage Vinit to the sum voltage (=Vdata+Vth) of the data voltage Vdata and the threshold voltage Vth.

In the emission period, a low voltage may be supplied to the emission control line ECL, and thus, the first transistor T1 and the second transistor T2 may be turned on. In this case, a current supplied to the light emitting device ED may be proportional to the square of a difference voltage between a gate-source voltage Vgs of the driving transistor Tdr and the threshold voltage Vth. In the emission period, a gate voltage (i.e., the voltage of the third node n3) of the driving transistor Tdr may be the sum voltage (=Vdata+Vth) of the data voltage Vdata and the threshold voltage Vth, and a source voltage of the driving transistor Tdr may be a pixel driving voltage Vdd supplied through the pixel driving voltage line PL. Therefore, the difference voltage between the gate-source voltage Vgs of the driving transistor Tdr and the threshold voltage Vth may be [((Vdata+Vth)−Vdd)−Vth=Vdata−Vdd]. Therefore, a current supplied to the light emitting device ED may be proportional to the square of a difference voltage (=Vdata−Vdd) between the data voltage Vdata and the pixel driving voltage Vdd.

That is, according to the present disclosure, a current supplied to the light emitting device ED may be irrelevant to the threshold voltage Vth of the driving transistor Tdr and may be determined by only the pixel driving voltage Vdd and the data voltage Vdata.

Therefore, according to the present disclosure, even when the driving transistor Tdr is degraded to cause a variation of the threshold voltage Vth of the driving transistor Tdr, a current supplied to the light emitting device ED may not be affected by the variation of the threshold voltage Vth. Accordingly, according to the present disclosure, the current may be controlled by only the data voltage Vdata regardless of the amount of variation of the threshold voltage Vth of the driving transistor Tdr.

Figure 5:
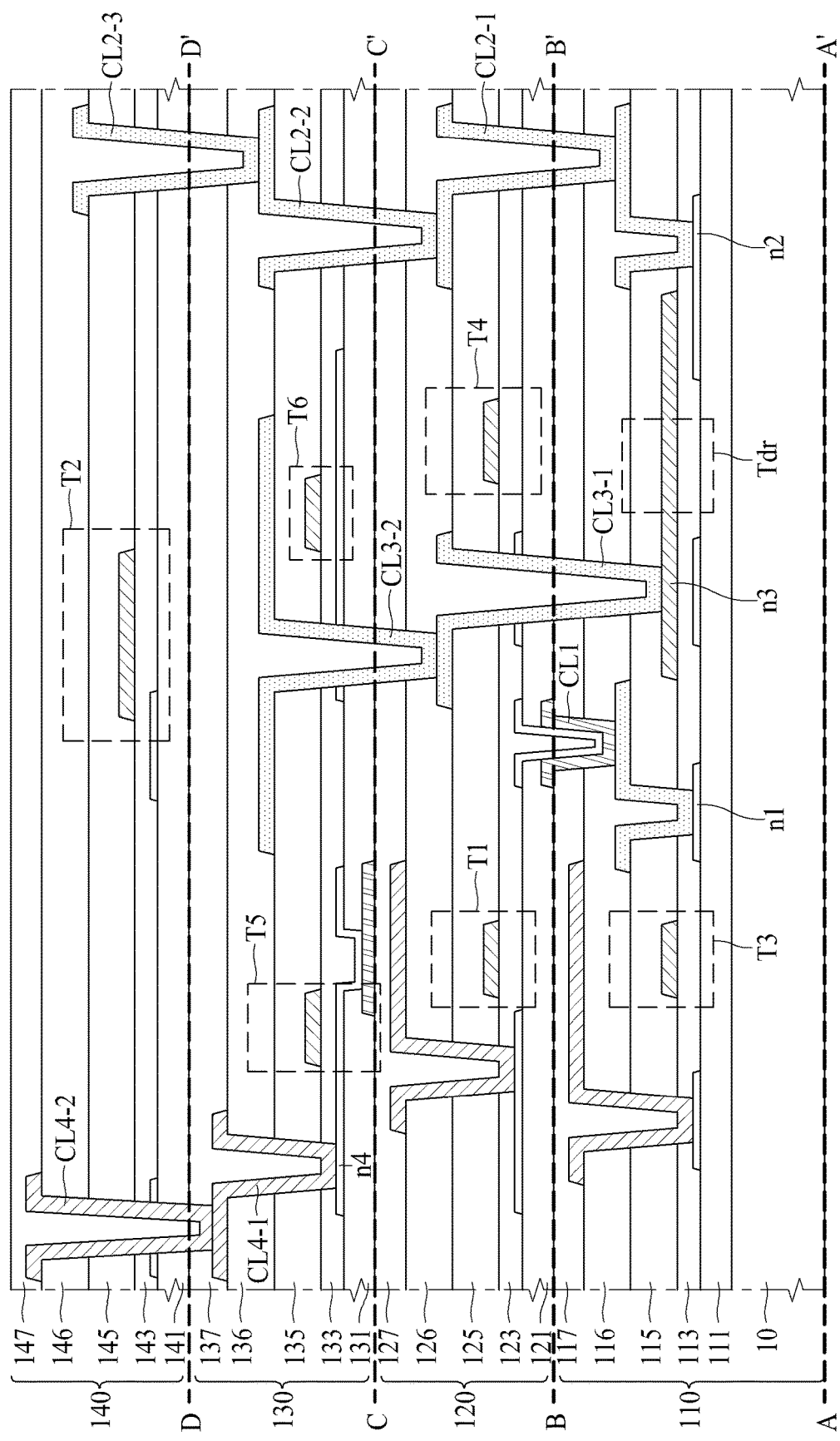
FIG. 5 is a cross-sectional view illustrating an example where a first pixel circuit layer, a second pixel circuit layer, a third pixel circuit layer, and a fourth pixel circuit layer applied to the present disclosure are coupled to one another.
Figure 6:
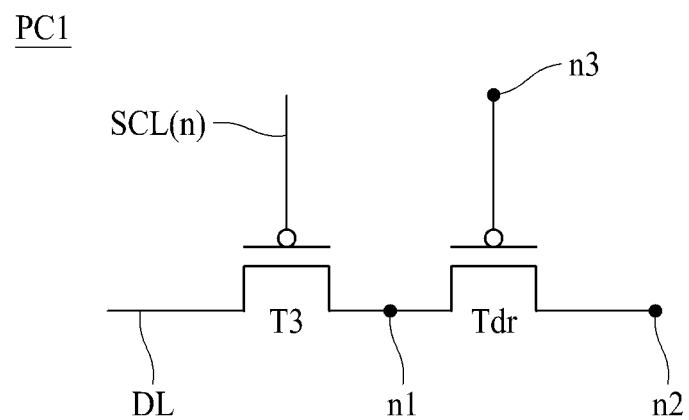
FIG. 6 is a diagram illustrating a first pixel circuit illustrated in FIG. 2.
Figure 7:
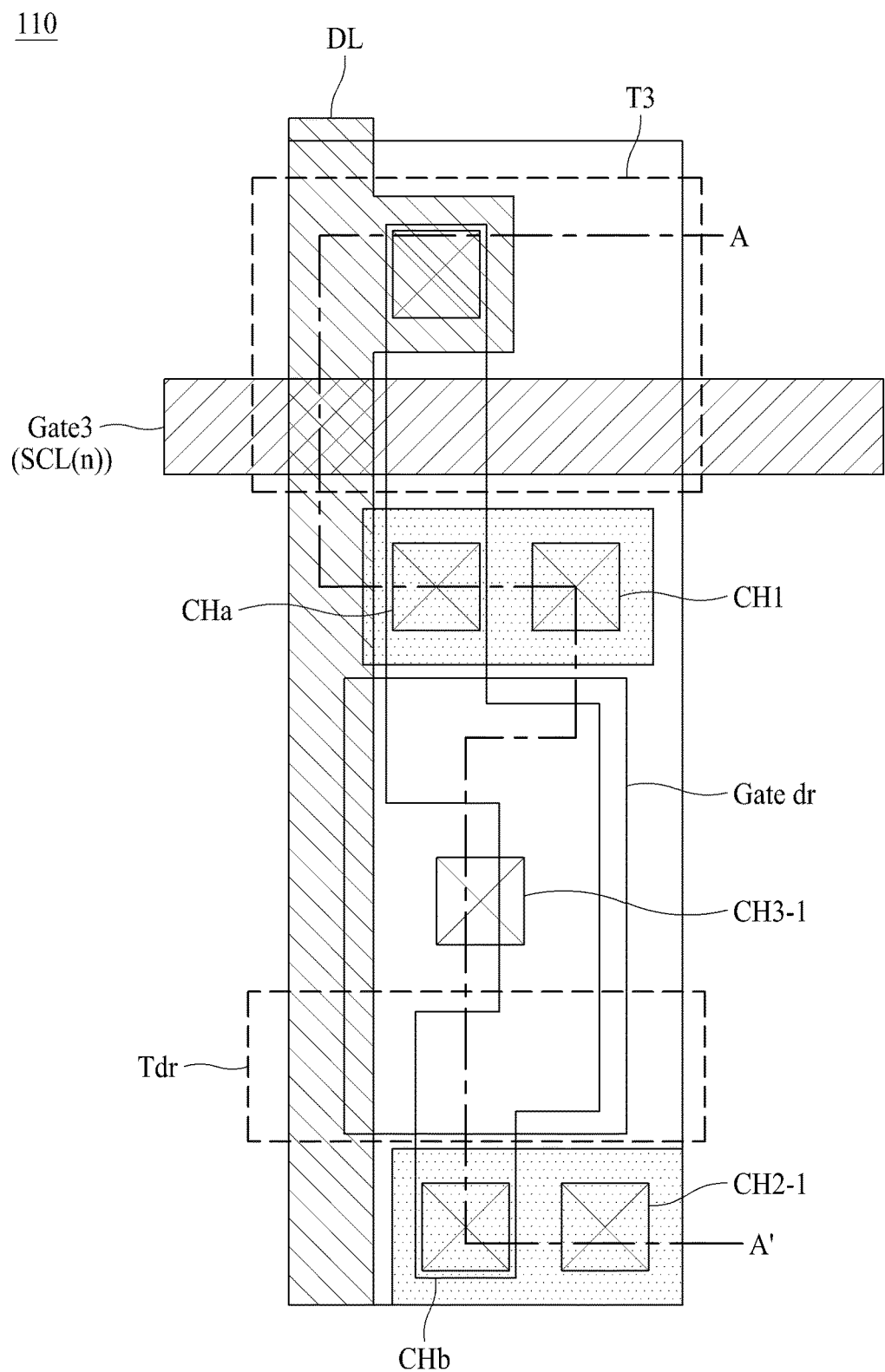
FIG. 7 is a diagram illustrating a layout of a first pixel circuit layer including the first pixel circuit illustrated in FIG. 6.
Figure 8:
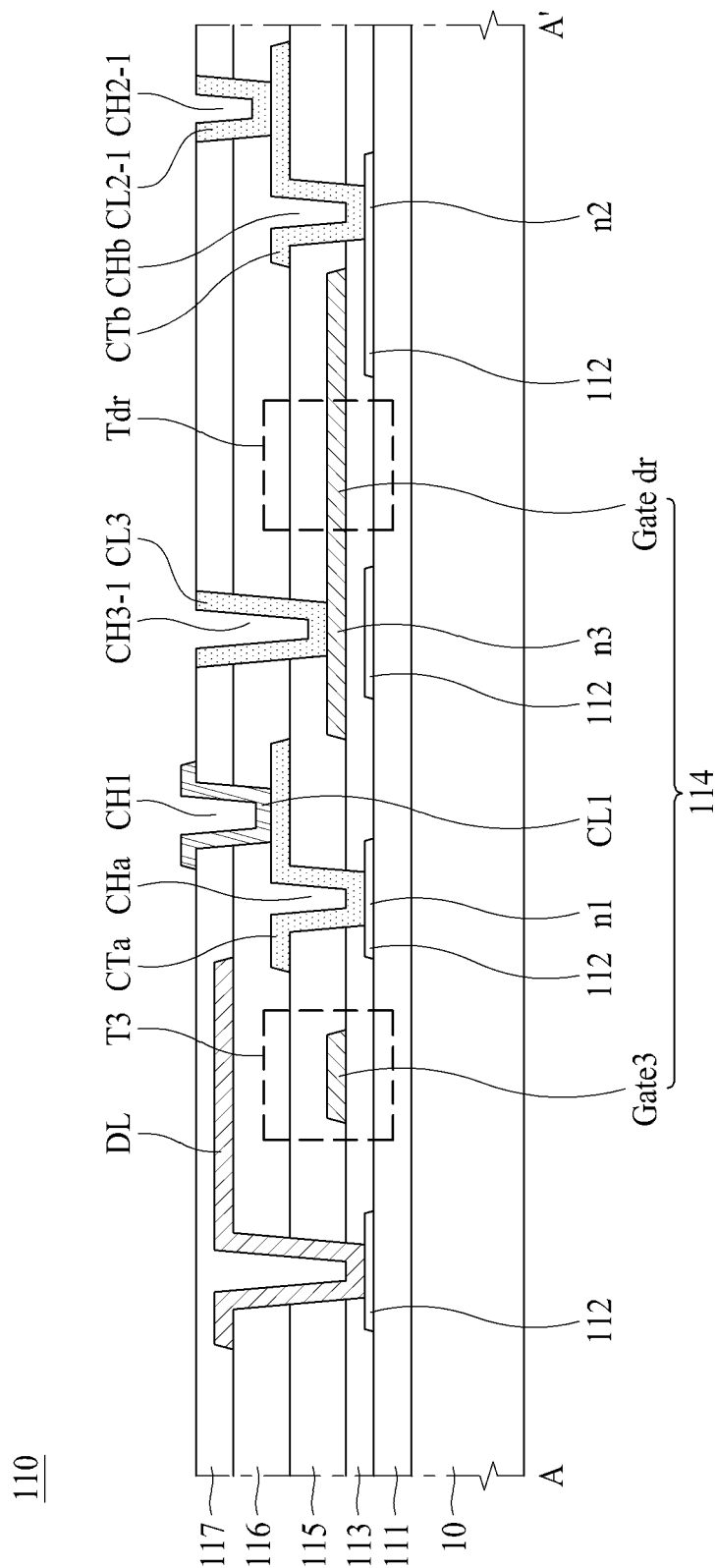
FIG. 8 is a cross-sectional view taken along line A-A' illustrated in FIG. 7.

FIG. 5 is a cross-sectional view illustrating an example where a first pixel circuit layer, a second pixel circuit layer, a third pixel circuit layer, and a fourth pixel circuit layer applied to the present disclosure are coupled to one another, FIG. 6 is a diagram illustrating a first pixel circuit illustrated in FIG. 2, FIG. 7 is a diagram illustrating a layout of a first pixel circuit layer including the first pixel circuit illustrated in FIG. 6, and FIG. 8 is a cross-sectional view taken along line A-A' illustrated in FIG. 7. That is, FIG. 6 illustrates a first pixel circuit included in one pixel, FIG. 7 illustrates a horizontal structure of the first pixel circuit layer in one pixel, and FIG. 8 illustrates a vertical structure of the first pixel circuit layer in one pixel.

In a pixel P of a light emitting display panel 100 according to an embodiment of the present disclosure, as illustrated in FIGS. 6 to 8, the first pixel circuit layer 110 may include a substrate 10, a first buffer layer 111, a first semiconductor layer 112 formed in a region, corresponding to the third transistor T3 and the driving transistor Tdr, of the substrate 10, a first gate insulation layer 113 at least partially covering the first semiconductor layer 112, a first gate electrode layer 114 formed in a region, corresponding to the third transistor T3 and the driving transistor Tdr, of the first gate insulation layer 113, a first passivation layer 115 at least partially covering the first gate electrode layer 114, an a$^{th}$ contact electrode CTa electrically connected to a region, provided in the first node n1, of the first semiconductor layer 112 through an a$^{th}$ contact hole CHa formed in the first passivation layer 115, a b$^{th}$ contact electrode CTb electrically connected to a region, provided in the second node n2, of the first semiconductor layer 112 through a b$^{th}$ contact hole CHb formed in the first passivation layer 115, a second passivation layer 116 at least partially covering the first passivation layer 115, a first planarization layer 117 at least partially covering the second passivation layer 116, a first connection line CL1 connected to the a$^{th}$ contact electrode CTa through a first contact hole CH1 formed in the first planarization layer 117 and the second passivation layer 116, a 2-1$^{th}$ connection line CL2-1 connected to the b$^{th}$ contact electrode CTb through a 2-1$^{th}$ contact hole CH2-1 formed in the first planarization layer 117 and the second passivation layer 116, and a 3-1$^{th}$ connection line CL3-1 connected to a driving gate electrode (Gate dr) of the driving transistor Tdr through a 3-1$^{th}$ contact hole CH3-1 formed in the first planarization layer 117, the second passivation layer 116, and the first passivation layer 115.

First, the substrate 10 may include a display area AA and a non-display area IA, and a plurality of pixels P may be provided in the display area AA. FIGS. 6 to 8 illustrate one pixel.

The first buffer layer 111 may be provided on the substrate 10, for preventing the penetration of water or increasing an adhesive force to the first semiconductor layer 112.

The first buffer layer 111 may include an organic material or an inorganic material and may be formed of at least two layers.

The first semiconductor layer 112 may be provided in an area where the third transistor T3 and the driving transistor Tdr are disposed. The first semiconductor layer 112 may include a polysilicon material.

The first semiconductor layer 112 according to an embodiment may include a plurality of channel areas, provided in a region overlapping with a third gate electrode (Gate 3) of the third transistor T3 and the driving gate electrode (Gate dr) of the driving transistor Tdr, and a plurality of high-concentration doping areas provided at a portion other than the channel areas. The high-concentration doping areas may be provided at both ends of the channel area.

Each of the plurality of channel areas may be used as a semiconductor layer of each of the third transistor T3 and the driving transistor Tdr.

The high-concentration doping areas may include metal properties and may be used as the first terminal or the second terminal of each of the third transistor T3 and the driving transistor Tdr.

For example, in a cross-sectional surface illustrated in FIG. 8, channel areas corresponding to the third gate electrode (Gate 3) and the driving gate electrode (Gate dr) are not illustrated, and only the high-concentration doping areas are illustrated.

Subsequently, the first gate insulation layer 113 may be formed all over the substrate 10 to at least partially cover or entirely cover the first semiconductor layer 112. The first gate insulation layer 113 according to an embodiment may include silicon oxide (SiOx), silicon nitride (SiNx), or a multilayer thereof.

Subsequently, the first gate electrode layer 114 may be provided on the first gate insulation layer 113. The first gate electrode layer 114 may include the third gate electrode (Gate 3) and the driving gate electrode (Gate dr).

The first gate electrode layer 114 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the first passivation layer 115 may be formed all over the substrate 10 to at least partially cover or entirely cover the first gate electrode layer 114. The first passivation layer 115 may include SiOx, SiNx, or a multilayer thereof.

Subsequently, the $a^{th}$ contact electrode CTa may be electrically connected to a region, provided in the first node n1, of the first semiconductor layer 112 through the $a^{th}$ contact hole CHa formed in the first passivation layer 115.

The $a^{th}$ contact electrode CTa, as illustrated in FIG. 8, may be connected to the first connection electrode CL1.

That is, as illustrated in FIGS. 2, 4, and 8, the first node n1 between the third transistor T3 and the driving transistor Tdr included in the first pixel circuit layer 110 may extend to the second pixel circuit layer 120 through the $a^{th}$ contact electrode CTa included in the first pixel circuit layer 110 and the first connection electrode CL1 included in the second pixel circuit layer 120.

Subsequently, the $b^{th}$ contact electrode CTb may be electrically connected to a region, provided in the second node n2, of the first semiconductor layer 112 through the $b^{th}$ contact hole CHb formed in the first passivation layer 115.

The $b^{th}$ contact electrode CTb, as illustrated in FIG. 8, may be connected to the 2-$1^{th}$ connection electrode CL2-1.

That is, as illustrated in FIGS. 2, 4, and 8, the second node n2 connected to the second terminal of the driving transistor Tdr included in the first pixel circuit layer 110 may extend to the second pixel circuit layer 120 through the $b^{th}$ contact electrode CTb included in the first pixel circuit layer 110 and the 2-$1^{th}$ connection electrode CL2-1 included in the second pixel circuit layer 120.

Subsequently, the second passivation layer 116 may be formed all over the substrate 10 to cover the $a^{th}$ contact electrode CTa and the second contact electrode CTb. The second passivation layer 116 may include SiOx, SiNx, or a multilayer thereof.

A data line DL may be provided in the second passivation layer 116.

Subsequently, the first planarization layer 117 may be formed all over the substrate 10 to cover the data line DL. The first planarization layer 117 may include SiOx, SiNx, or a multilayer thereof.

Subsequently, the first connection line CL1 may be connected to the $a^{th}$ contact electrode CTa through the first contact hole CH1 formed in the first planarization layer 117 and the second passivation layer 116.

The first connection line CL1 may be connected to the second terminal of the first transistor T1 included in the second pixel circuit layer 120.

That is, the first connection line CL1 may connect the second terminal of the first transistor T1, included in the second pixel circuit layer 120, to the second terminal of the third transistor T3 and the first terminal of the driving transistor Tdr included in the first pixel circuit layer 110. A node connected to the first terminal of the driving transistor Tdr, the second terminal of the third transistor T3, and the second terminal of the first transistor T1 may be the first node n1. To provide an additional description, the first connection line CL1 may connect the first node n1, included in the first pixel circuit layer 110, to the first node n1 included in the second pixel circuit layer 120.

Subsequently, the 2-$1^{th}$ connection line CL2-1 may be connected to the $b^{th}$ contact electrode CTb through a 2-$1^{th}$ contact hole CH2-1 formed in the first planarization layer 117 and the second passivation layer 116.

The 2-1th connection line CL2-1 may be connected to the second terminal of the fourth transistor T4 included in the second pixel circuit layer 120.

That is, the 2-$1^{th}$ connection line CL2-1 may connect the second terminal of the driving transistor Tdr, included in the first pixel circuit layer 110, to the second terminal of the fourth transistor T4 included in the second pixel circuit layer 120. A node connected to the second terminal of the driving transistor Tdr and the second terminal of the fourth transistor T4 may be the second node n2. To provide an additional description, the 2-$1^{th}$ connection line CL2-1 may connect the second node n2, included in the first pixel circuit layer 110, to the second node n2 included in the second pixel circuit layer 120.

Finally, the 3-$1^{th}$ connection line CL3-1 may be connected to the driving gate electrode (Gate dr) of the driving transistor Tdr through a 3-$1^{th}$ contact hole CH3-1 formed in the first planarization layer 117, the second passivation layer 116, and the first passivation layer 115.

The 3-$1^{th}$ connection line CL3-1 may be connected to the first terminal of the fourth transistor T4 included in the second pixel circuit layer 120.

That is, the 3-$1^{th}$ connection line CL3-1 may connect the driving gate electrode (Gate dr) of the driving transistor Tdr, included in the first pixel circuit layer 110, to the first terminal of the fourth transistor T4 included in the second pixel circuit layer 120. A node connected to the driving gate electrode (Gate dr) of the driving transistor Tdr and the first terminal of the fourth transistor T4 may be the third node n3. To provide an additional description, the 3-$1^{th}$ connection line CL3-1 may connect the third node n3, included in the first pixel circuit layer 110, to the third node n3 included in the second pixel circuit layer 120. The third node n3 may be connected to the second electrode of the capacitor C included in the third pixel circuit layer 130.

Figure 9:
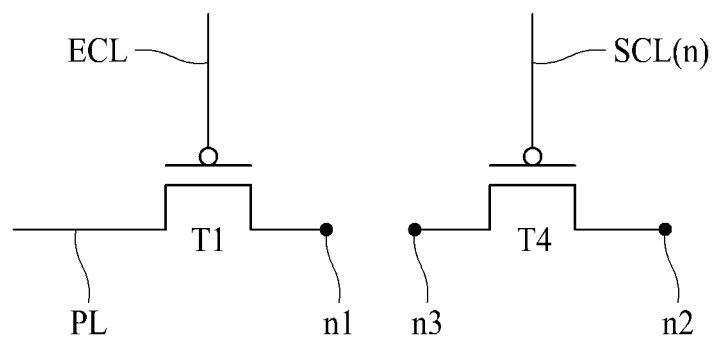
FIG. 9 is a diagram illustrating a second pixel circuit illustrated in FIG. 2.
Figure 10:
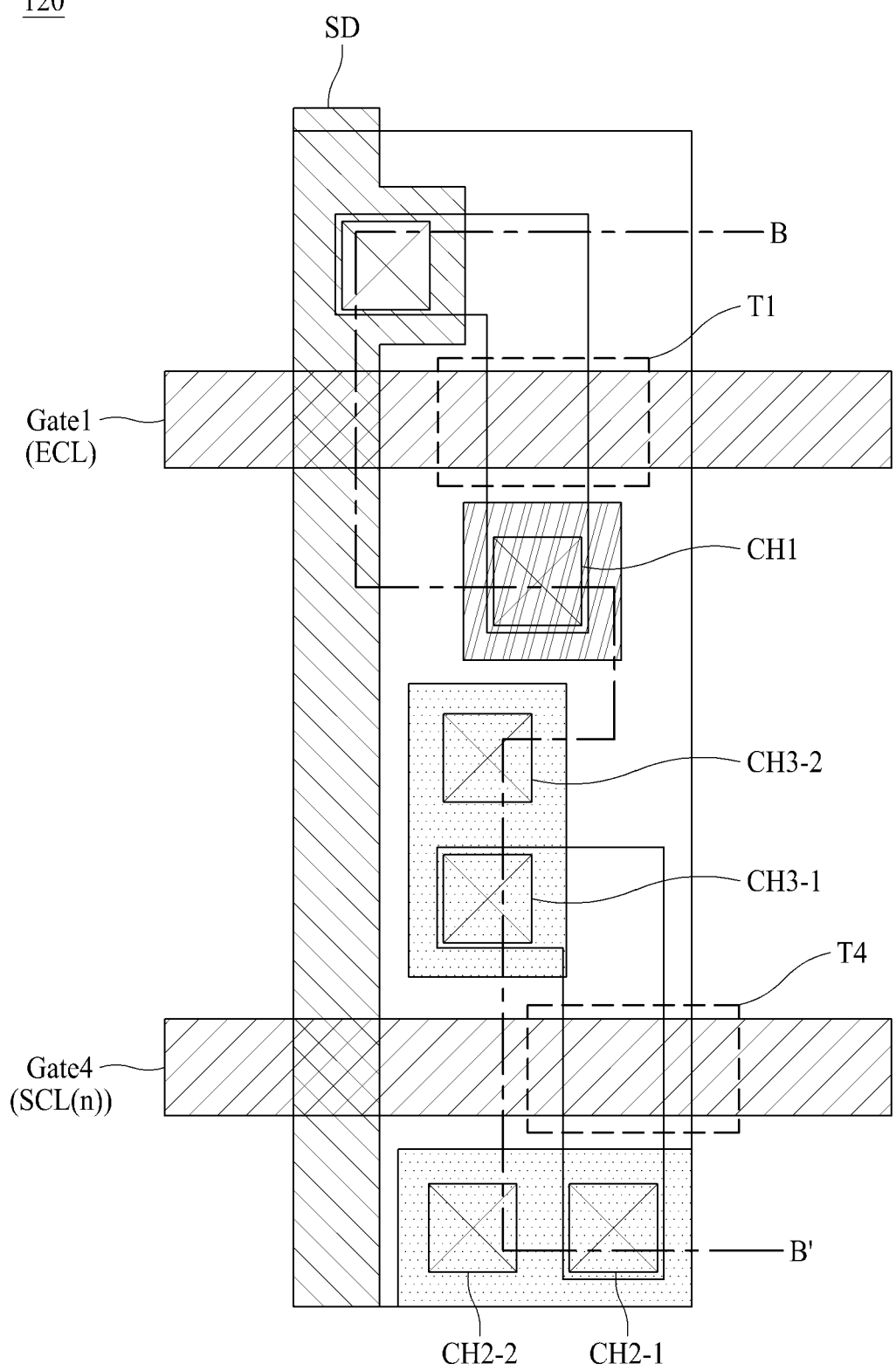
FIG. 10 is a diagram illustrating a layout of a second pixel circuit layer including the second pixel circuit illustrated in FIG. 9.
Figure 11:
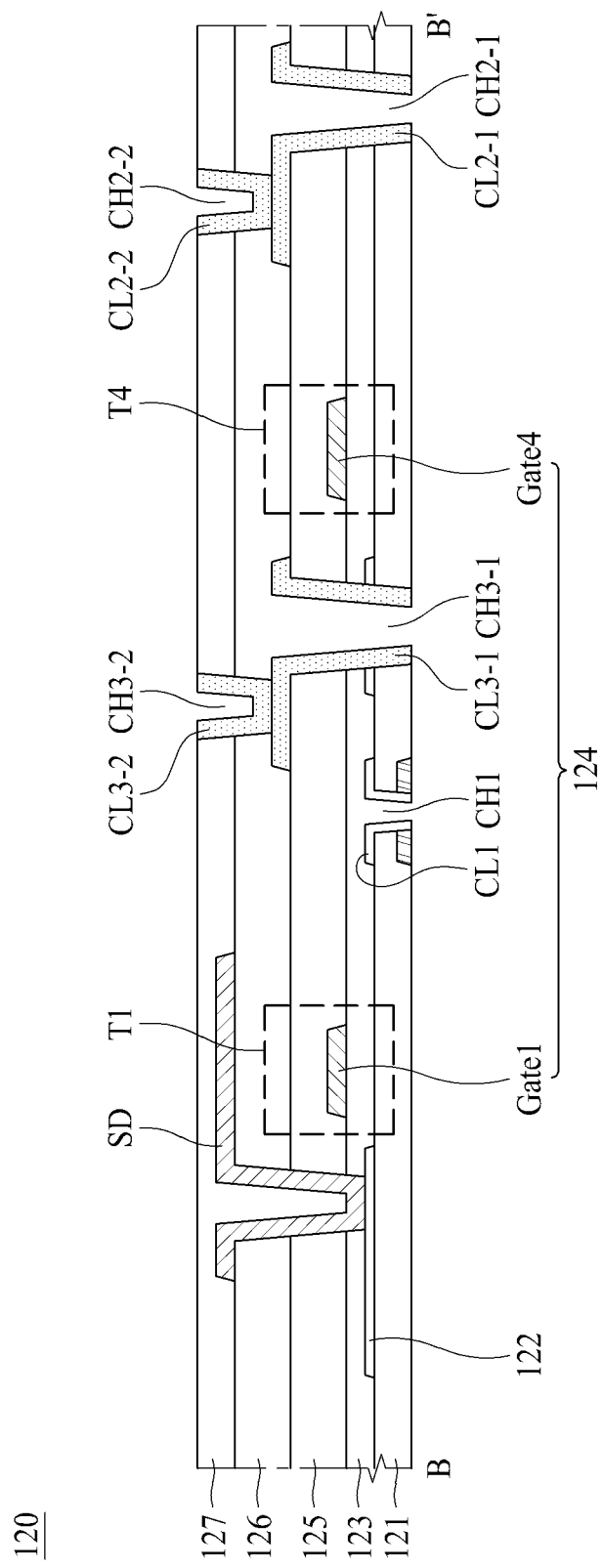
FIG. 11 is a cross-sectional view taken along line B-B' illustrated in FIG. 10.

FIG. 9 is a diagram illustrating a second pixel circuit illustrated in FIG. 2, FIG. 10 is a diagram illustrating a layout of a second pixel circuit layer including the second pixel circuit illustrated in FIG. 9, and FIG. 11 is a cross-sectional view taken along line B-B' illustrated in FIG. 10. That is, FIG. 9 illustrates a second pixel circuit PC2 included in one pixel, FIG. 10 illustrates a horizontal structure of the second pixel circuit layer 120 in one pixel, and FIG. 9 illustrates a vertical structure of the second pixel circuit layer 120 in one pixel.

In a light emitting display panel according to an embodiment of the present disclosure, as illustrated in FIGS. 9 to 11, the second pixel circuit layer 120 may include a second buffer layer 121 at least partially covering the first planarization layer 117, a second semiconductor layer 122 formed on the second buffer layer 121, a second gate insulation layer 123 at least partially covering the second semiconductor layer 122, a second gate electrode layer 124 formed on the second gate insulation layer 123, a third passivation layer 125 at least partially covering the second gate electrode layer 124, a 3-$1^{th}$ connection line CL3-1 connected to the third node n3 through a 3-$1^{th}$ contact hole CH3-1 formed in the third passivation layer 125, the second gate insulation layer 123, the second buffer layer 121, the first planarization layer 117, the second passivation layer 116, and the first passivation layer 115, a 2-1$^{th}$ connection line CL2-1 connected to the second node n2 through a 2-1$^{th}$ contact hole CH2-1 formed in the third passivation layer 125, the second gate insulation layer 123, the second buffer layer 121, the first planarization layer 117, and the second passivation layer 116, a fourth passivation layer 126 at least partially covering the third passivation layer 125, a second planarization layer 127 at least partially covering the fourth passivation layer 126, a 3-2$^{th}$ connection line CL3-2 connected to the 3-1$^{th}$ connection line CL3-1 through a 3-2$^{th}$ contact hole CH3-2 formed in the second planarization layer 127 and the fourth passivation layer 126, and a 2-2$^{th}$ connection line CL2-2 connected to the 2-1$^{th}$ connection line CL2-1 through a 2-2$^{th}$ contact hole CH2-2 formed in the second planarization layer 127 and the fourth passivation layer 126.

First, the second buffer layer 121 may be provided on the substrate 10, for preventing the penetration of water or increasing an adhesive force to the second semiconductor layer 122.

The second buffer layer 121 may include an organic material or an inorganic material and may be formed of at least two layers.

The first contact hole CH1 may be formed in the second buffer layer 121, and the first connection line CL1 may be provided in the first contact hole CH1. The first connection line CL1 provided in the second buffer layer 121 may be connected to the second terminal of the first transistor T1.

In this case, the first connection line CL1 provided in the first pixel circuit layer 110 and the first connection line CL1 provided in the second pixel circuit layer 120 may be provided as one body, or as illustrated in FIGS. 5, 8, and 11, may be provided as two lines which are independently provided and electrically connected to each other.

Subsequently, the second semiconductor layer 122 may be provided in an area where the first transistor T1 and the second transistor T2 are disposed. The second semiconductor layer 122 may include a polysilicon material.

The second semiconductor layer 122 according to an embodiment may include a plurality of channel areas, provided in a region overlapping with a first gate electrode (Gate 1) of the first transistor T1 and a fourth gate electrode (Gate 4) of the fourth transistor T4, and a plurality of high-concentration doping areas provided at a portion other than the channel areas. The high-concentration doping areas may be provided at both ends of the channel area.

Each of the plurality of channel areas may be used as a semiconductor layer of each of the first transistor T1 and the fourth transistor T4.

The high-concentration doping areas may include metal properties and may be used as the first terminal or the second terminal of each of the first transistor T1 and the fourth transistor T4.

For example, in a cross-sectional surface illustrated in FIG. 11, channel areas corresponding to the first gate electrode (Gate 1) and the fourth gate electrode (Gate 4) are not illustrated, and only the high-concentration doping areas are illustrated.

Subsequently, the second gate insulation layer 123 may be formed all over the substrate 10 to cover the second semiconductor layer 122. The second gate insulation layer 123 according to an embodiment may include SiOx, SiNx, or a multilayer thereof.

Subsequently, the second gate electrode layer 124 may be provided on the second gate insulation layer 123. The second gate electrode layer 124 may include the first gate electrode (Gate 1) and the fourth gate electrode (Gate 4).

The second gate electrode layer 124 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the third passivation layer 125 may be formed all over the substrate 10 to cover the second gate electrode layer 124. The third passivation layer 125 may include SiOx, SiNx, or a multilayer thereof.

Subsequently, the 3-1$^{th}$ connection line CL3-1 may be connected to the third node n3 through a 3-1$^{th}$ contact hole CH3-1 formed in the third passivation layer 125, the second gate insulation layer 123, the second buffer layer 121, the first planarization layer 117, the second passivation layer 116, and the first passivation layer 115.

The 3-1$^{th}$ connection line CL3-1 may be connected to the first terminal of the fourth transistor T4 included in the second pixel circuit layer 120.

Subsequently, the 2-1$^{th}$ connection line CL2-1 may be connected to the second node n2 through a 2-1$^{th}$ contact hole CH2-1 formed in the third passivation layer 125, the second gate insulation layer 123, the second buffer layer 121, the first planarization layer 117, and the second passivation layer 116.

The 2-1th connection line CL2-1 may be connected to the second terminal of the fourth transistor T4 included in the second pixel circuit layer 120.

Subsequently, the fourth passivation layer 126 may be formed all over the substrate 10 to cover the 3-1$^{th}$ connection line CL3-1 and the 2-1$^{th}$ connection line CL2-1. The fourth passivation layer 126 may include SiOx, SiNx, or a multilayer thereof.

A source-drain electrode SD, used as a source or a drain of each of the first transistor T1 and the fourth transistor T4, may be provided in the fourth passivation layer 126.

Subsequently, the second planarization layer 127 may be formed all over the substrate 10 to cover the 3 source-drain electrode SD. The second planarization layer 127 may include SiOx, SiNx, or a multilayer thereof.

Subsequently, the 3-2$^{th}$ connection line CL3-2 may be connected to the 3-1$^{th}$ connection line CL3-1 through the 3-2$^{th}$ contact hole CH3-2 formed in the second planarization layer 127 and the second passivation layer 126.

The 3-2$^{th}$ connection line CL3-2 may be connected to the second electrode of the capacitor C and the second terminal of the sixth transistor T6 included in the third pixel circuit layer 130.

That is, the 3-2$^{th}$ connection line CL3-2 may connect the first terminal of the fourth transistor T4, included in the second pixel circuit layer 120, to the second electrode of the capacitor C and the second terminal of the sixth transistor T6 included in the third pixel circuit layer 130.

To provide an additional description, the driving gate electrode (Gate dr) of the driving transistor Tdr included in the first pixel circuit layer 110, the first terminal of the fourth transistor T4 included in the second pixel circuit layer 120, and the second electrode of the capacitor C and the second terminal of the sixth transistor T6 included in the third pixel circuit layer 130 may be connected to one another by the 3-1$^{th}$ connection line CL3-1 and the 3-2$^{th}$ connection line CL3-2.

A node, connected to the driving gate electrode (Gate dr) of the driving transistor Tdr, the first terminal of the fourth transistor T4, the second terminal of the sixth transistor T6, and the second electrode of the capacitor C, may be the third node n3.

Finally, the 2-2th connection line CL2-2 may be connected to the 2-1$^{th}$ connection line CL2-1 through the 2-2$^{th}$ contact hole CH2-2 formed in the second planarization layer 127 and the second passivation layer 126.

The 2-2$^{th}$ connection line CL2-2 may be connected to the first terminal of the second transistor T2 included in the fourth pixel circuit layer 140.

That is, the 2-2th connection line CL2-2 may connect the second terminal of the fourth transistor T4, included in the second pixel circuit layer 120, to the first terminal of the second transistor T2 included in the fourth pixel circuit layer 140.

To provide an additional description, the second terminal of the driving transistor Tdr included in the first pixel circuit layer 110, the second terminal of the fourth transistor T4 included in the second pixel circuit layer 120, and the first terminal of the second transistor T2 included in the fourth pixel circuit layer 140 may be connected to one another by the 2-1$^{th}$ connection line CL2-1 and the 2-2$^{th}$ connection line CL2-2.

A node, connected to the second terminal of the driving transistor Tdr, the second terminal of the fourth transistor T4, and the first terminal of the second transistor T2, may be the second node n2.

Figure 12:
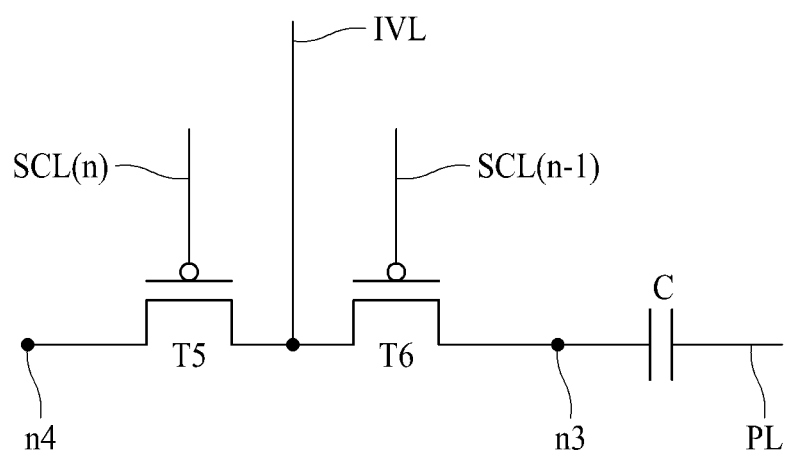
FIG. 12 is a diagram illustrating a third pixel circuit illustrated in FIG. 2.
Figure 13:
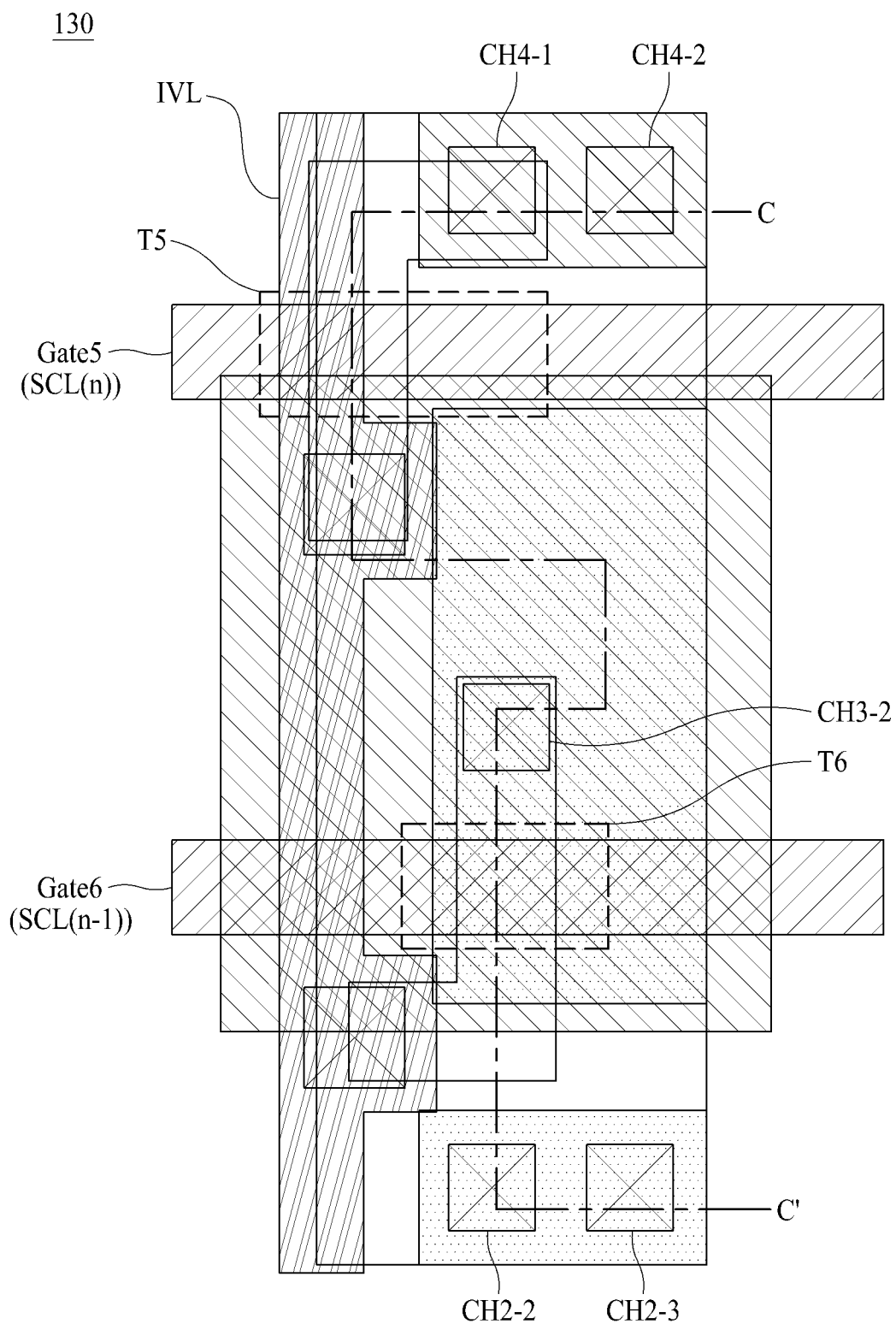
FIG. 13 is a diagram illustrating a layout of a third pixel circuit layer including the third pixel circuit illustrated in FIG. 12.
Figure 14:
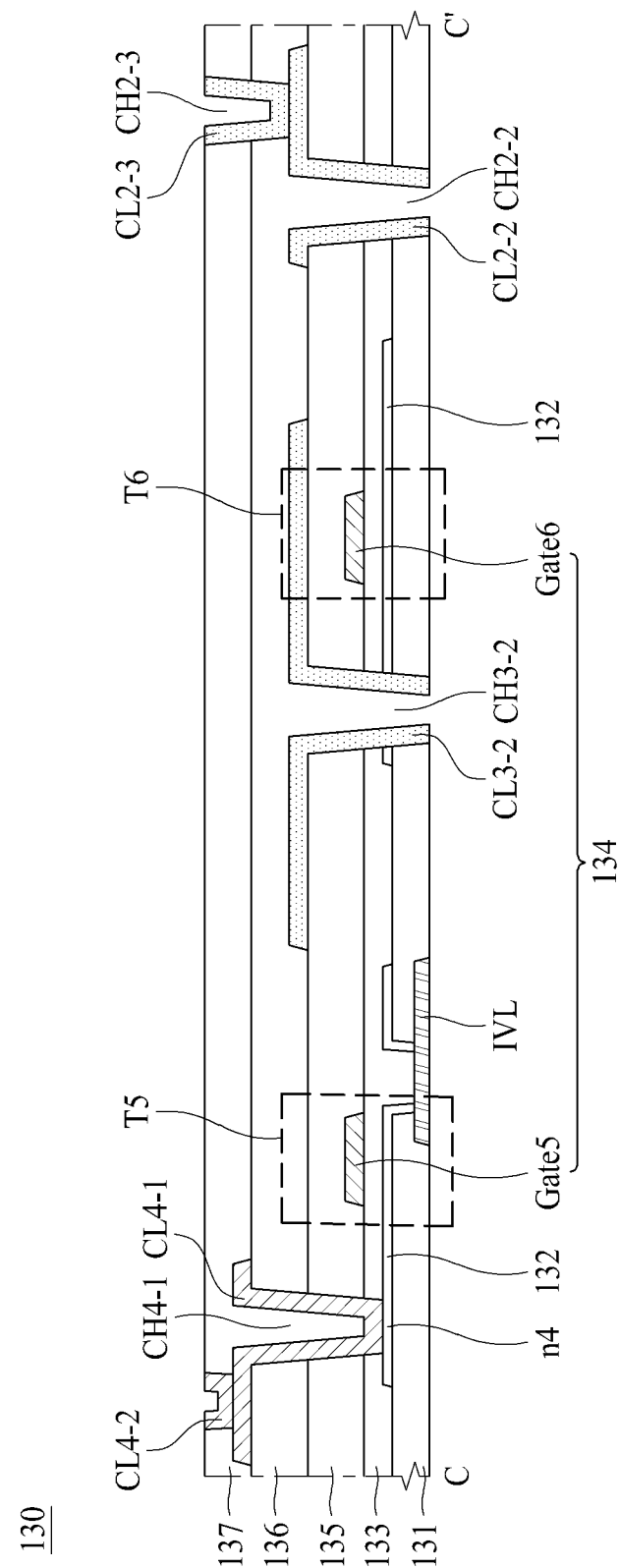
FIG. 14 is a cross-sectional view taken along line C-C' illustrated in FIG. 13.

FIG. 12 is a diagram illustrating a third pixel circuit illustrated in FIG. 2, FIG. 13 is a diagram illustrating a layout of a third pixel circuit layer including the third pixel circuit illustrated in FIG. 12, and FIG. 14 is a cross-sectional view taken along line C-C' illustrated in FIG. 13. That is, FIG. 12 illustrates a third pixel circuit PC3 included in one pixel, FIG. 13 illustrates a horizontal structure of the third pixel circuit layer 130 in one pixel, and FIG. 14 illustrates a vertical structure of the third pixel circuit layer 130 in one pixel.

In a light emitting display panel according to an embodiment of the present disclosure, as illustrated in FIGS. 12 to 14, the third pixel circuit layer 130 may include a third buffer layer 131 at least partially covering the second planarization layer 127, a third semiconductor layer 132 formed on the third buffer layer 131, a third gate insulation layer 133 at least partially covering the third semiconductor layer 132, a third gate electrode layer 134 formed on the third gate insulation layer 133, a fifth passivation layer 135 at least partially covering the third gate electrode layer 134, a 3-2th connection line CL3-2 connected to the third node n3 through a 3-2$^{th}$ contact hole CH3-2 formed in the fifth passivation layer 135, the third gate insulation layer 133, the third buffer layer 131, the second planarization layer 127, and the fourth passivation layer 126, a 2-2$^{th}$ connection line CL2-2 connected to the second node n2 through a 2-2$^{th}$ contact hole CH2-2 formed in the fifth passivation layer 135, the third gate insulation layer 133, the third buffer layer 131, the second planarization layer 127, and the fourth passivation layer 126, a sixth passivation layer 136 at least partially covering the fifth passivation layer 135, a 4-1$^{th}$ connection line CL4-1 connected to the second terminal of the fifth transistor T5 through a 4-1$^{th}$ contact hole CH4-1 formed in the sixth passivation layer 136, the fifth passivation layer 135, and the third gate insulation layer 133, a third planarization layer 137 at least partially covering the 4-1$^{th}$ connection line CL4-1, a 2-3$^{th}$ connection line CL2-3 connected to the 2-2$^{th}$ connection line CL2-2 through a 2-3$^{th}$ contact hole CH2-3 formed in the third planarization layer 137 and the sixth passivation layer 136, and a 4-2$^{th}$ connection line CL4-2 connected to the 4-1$^{th}$ connection line CL4-1 through a 4-2$^{th}$ contact hole CH4-2 formed in the third planarization layer 137.

First, the third buffer layer 131 may be provided on the substrate 10, for preventing the penetration of water or increasing an adhesive force to the third semiconductor layer 132.

The third buffer layer 131 may include an organic material or an inorganic material and may be formed of at least two layers.

The 3-2$^{th}$ contact hole CH3-2 may be formed in the third buffer layer 131, and the 3-2$^{th}$ connection line CL3-2 may be provided in the 3-2$^{th}$ contact hole CH3-2. The 3-2$^{th}$ connection line CL3-2 provided in the third buffer layer 131 may be connected to the driving gate electrode of the driving transistor Tdr.

The initialization voltage line IVL may be provided between the third buffer layer 131 and the second planarization layer 127.

Subsequently, the third semiconductor layer 132 may be provided in an area where the fifth transistor T5 and the sixth transistor T6 are disposed. The third semiconductor layer 132 may include a polysilicon material.

The third semiconductor layer 132 according to an embodiment may include a plurality of channel areas, provided in a region overlapping with a fifth gate electrode (Gate 5) of the fifth transistor T5 and a sixth gate electrode (Gate 6) of the sixth transistor T6, and a plurality of high-concentration doping areas provided at a portion other than the channel areas. The high-concentration doping areas may be provided at both ends of the channel area.

Each of the plurality of channel areas may be used as a semiconductor layer of each of the fifth transistor T5 and the sixth transistor T6.

The high-concentration doping areas may include metal properties and may be used as the first terminal or the second terminal of each of the fifth transistor T5 and the sixth transistor T6.

For example, in a cross-sectional surface illustrated in FIG. 14, channel areas corresponding to the fifth gate electrode (Gate 5) and the sixth gate electrode (Gate 6) and only the high-concentration doping areas connected to the channel areas are illustrated.

Particularly, one end (i.e., a high-concentration doping area) of the third semiconductor layer 132 configuring the fifth transistor T5 may be connected to the initialization voltage line IVL to configure the first terminal of the fifth transistor T5, and the other end (i.e., another high-concentration doping area) of the third semiconductor layer 132 configuring the fifth transistor T5 may configure the second terminal of the fifth transistor T5. The second terminal of the fifth transistor T5 may be connected to the second terminal of the second transistor T2 through the 4-1$^{th}$ connection line CL4-1 and the 4-2$^{th}$ connection line CL4-2.

Subsequently, the third gate insulation layer 133 may be formed all over the substrate 10 to cover the third semiconductor layer 132. The third gate insulation layer 133 according to an embodiment may include SiOx, SiNx, or a multilayer thereof.

Subsequently, the third gate electrode layer 134 may be provided on the third gate insulation layer 133. The third gate electrode layer 134 may include the fifth gate electrode (Gate 5) and the sixth gate electrode (Gate 6).

The third gate electrode layer 134 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the fifth passivation layer 135 may be formed all over the substrate 10 to cover the third gate electrode layer 134. The fifth passivation layer 135 may include SiOx, SiNx, or a multilayer thereof.

Subsequently, the 3-2$^{th}$ connection line CL3-2 may be connected to the third node n3 through a 3-2$^{th}$ contact hole CH3-2 formed in the fifth passivation layer 135, the third gate insulation layer 133, the third buffer layer 131, the second planarization layer 127, and the fourth passivation layer 126.

The 3-2$^{th}$ connection line CL3-2 may be connected to the second electrode of the capacitor C and the second terminal of the sixth transistor T6 included in the third pixel circuit layer 130.

That is, the 3-2th connection line CL3-2 may connect the first terminal of the fourth transistor T4, included in the second pixel circuit layer 120, to the second electrode of the capacitor C and the second terminal of the sixth transistor T6 included in the third pixel circuit layer 130.

To provide an additional description, the driving gate electrode (Gate dr) of the driving transistor Tdr included in the first pixel circuit layer 110, the first terminal of the fourth transistor T4 included in the second pixel circuit layer 120, and the second electrode of the capacitor C and the second terminal of the sixth transistor T6 included in the third pixel circuit layer 130 may be connected to one another by the 3-1$^{th}$ connection line CL3-1 and the 3-2$^{th}$ connection line CL3-2.

A node, connected to the driving gate electrode (Gate dr) of the driving transistor Tdr, the first terminal of the fourth transistor T4, the second terminal of the sixth transistor T6, and the second electrode of the capacitor C, may be the third node n3.

Subsequently, the 2-2$^{th}$ connection line CL2-2 may be connected to the second node n2 through a 2-2$^{th}$ contact hole CH2-2 formed in the fifth passivation layer 135, the third gate insulation layer 133, the third buffer layer 131, the second planarization layer 127, and the fourth passivation layer 126.

The 2-2$^{th}$ connection line CL2-2 may be connected to the first terminal of the second transistor T2 included in the fourth pixel circuit layer 140.

That is, the 2-2th connection line CL2-2 may connect the second terminal of the fourth transistor T4, included in the second pixel circuit layer 120, to the first terminal of the second transistor T2 included in the fourth pixel circuit layer 140.

To provide an additional description, the second terminal of the driving transistor Tdr included in the first pixel circuit layer 110, the second terminal of the fourth transistor T4 included in the second pixel circuit layer 120, and the first terminal of the second transistor T2 included in the fourth pixel circuit layer 140 may be connected to one another by the 2-1$^{th}$ connection line CL2-1 and the 2-2$^{th}$ connection line CL2-2.

A node, connected to the second terminal of the driving transistor Tdr, the second terminal of the fourth transistor T4, and the first terminal of the second transistor T2, may be the second node n2.

Subsequently, the sixth passivation layer 136 may be formed all over the substrate 10 to cover the 3-2$^{th}$ connection line CL3-2 and the 2-2th connection line CL2-2. The sixth passivation layer 136 may include SiOx, SiNx, or a multilayer thereof.

Subsequently, the 4-1$^{th}$ connection line CL4-1 may be connected to the second terminal of the fifth transistor T5 through the 4-1$^{th}$ contact hole CH4-1 formed in the sixth passivation layer 136, the fifth passivation layer 135, and the third gate insulation layer 133.

Subsequently, the third planarization layer 137 may be formed all over the substrate 10 to cover the 4-1$^{th}$ connection line CL4-1. The third planarization layer 137 may include SiOx, SiNx, or a multilayer thereof.

Subsequently, the 2-3$^{th}$ connection line CL2-3 may be connected to the 2-2$^{th}$ connection line CL2-2 through the 2-3th contact hole CH2-3 formed in the third planarization layer 137 and the sixth passivation layer 136.

The 2-3th connection line CL2-3 may be connected to the first terminal of the second transistor T2 included in the fourth pixel circuit layer 140.

That is, the 2-3$^{th}$ connection line CL2-3 may connect the second terminal of the fourth transistor T4, included in the second pixel circuit layer 120, to the first terminal of the second transistor T2 included in the fourth pixel circuit layer 140.

To provide an additional description, the second terminal of the driving transistor Tdr included in the first pixel circuit layer 110, the second terminal of the fourth transistor T4 included in the second pixel circuit layer 120, and the first terminal of the second transistor T2 included in the fourth pixel circuit layer 140 may be connected to one another by the 2-1$^{th}$ connection line CL2-1, the 2-2th connection line CL2-2, and the 2-3th connection line CL2-3.

A node, connected to the second terminal of the driving transistor Tdr, the second terminal of the fourth transistor T4, and the first terminal of the second transistor T2, may be the second node n2.

Finally, the 4-2th connection line CL4-2 may be connected to the 4-1$^{th}$ connection line CL4-1 through the 4-2$^{th}$ contact hole CH4-2 formed in the third planarization layer 137.

The 4-2$^{th}$ connection line CL4-2 may be connected to the second terminal of the second transistor T2 included in the fourth pixel circuit layer 140.

That is, the 4-2$^{th}$ connection line CL4-2 may connect the second terminal of the fifth transistor T5, included in the third pixel circuit layer 130, to the second terminal of the second transistor T2 included in the fourth pixel circuit layer 140.

A node, connected to the second terminal of the second transistor T2, the second terminal of the fifth transistor T5, and the pixel driving electrode AE (an anode electrode) of the light emitting device ED, may be the fourth node n4.

The capacitor C included in the third pixel circuit layer 130 may include metal, which is formed in the fifth passivation layer 135 along with the 2-2$^{th}$ connection line CL2-2, and metal which is formed in the sixth passivation layer 136 along with the 4-1$^{th}$ connection line CL4-1. Here, the metal formed in the fifth passivation layer 135 may be first metal (or second metal), and the metal formed in the sixth passivation layer 136 may be the second metal (or the first metal).

The first electrode of the capacitor C may be connected to, through a capacitor connection line, the first terminal of the first transistor T1 included in the first pixel circuit layer 110, and the second electrode of the capacitor C may be connected to the second terminal of the sixth transistor T6.

Figure 15:
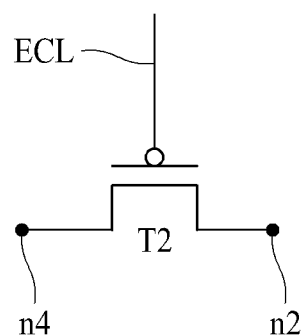
FIG. 15 is a diagram illustrating a fourth pixel circuit illustrated in FIG. 2.
Figure 16:
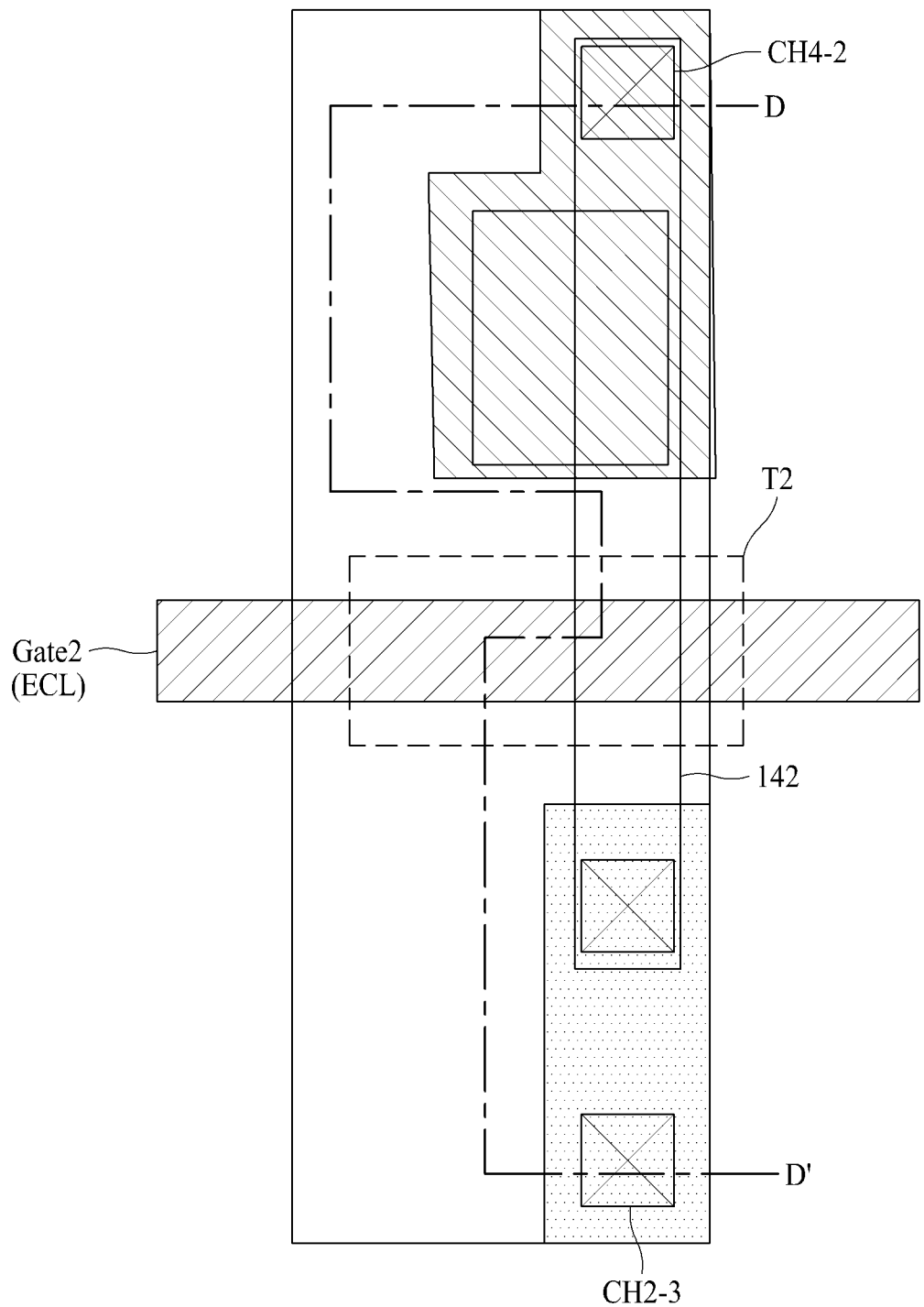
FIG. 16 is a diagram illustrating a layout of a fourth pixel circuit layer including the fourth pixel circuit illustrated in FIG. 15.
Figure 17:
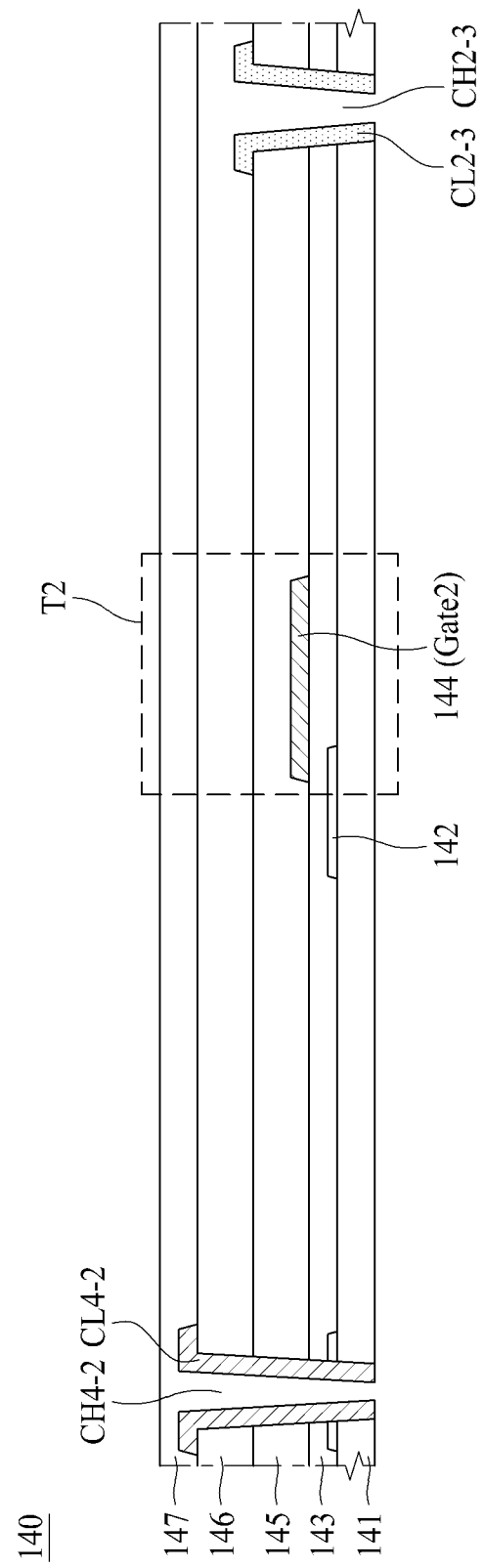
FIG. 17 is a cross-sectional view taken along line D-D' illustrated in FIG. 16.

FIG. 15 is a diagram illustrating a fourth pixel circuit illustrated in FIG. 2, FIG. 16 is a diagram illustrating a layout of a fourth pixel circuit layer including the fourth pixel circuit illustrated in FIG. 15, and FIG. 17 is a cross-sectional view taken along line D-D' illustrated in FIG. 16.

That is, FIG. 15 illustrates a fourth pixel circuit PC1 included in one pixel, FIG. 16 illustrates a horizontal structure of the fourth pixel circuit layer 140 in one pixel, and FIG. 17 illustrates a vertical structure of the fourth pixel circuit layer 140 in one pixel.

In a light emitting display panel according to an embodiment of the present disclosure, as illustrated in FIGS. 15 to 17, the fourth pixel circuit layer 140 may include a fourth buffer layer 141 at least partially covering the third planarization layer 137, a fourth semiconductor layer 142 formed on the fourth buffer layer 141, a fourth gate insulation layer 143 at least partially covering the fourth semiconductor layer 142, a fourth gate electrode layer 144 formed on the fourth gate insulation layer 143, a seventh passivation layer 145 at least partially covering the fourth gate electrode layer 144, a 2-3$^{th}$ connection line CL2-3 connected to the second node n2 through a 2-3$^{th}$ contact hole CH2-3 formed in the seventh passivation layer 145, the fourth gate insulation layer 143, the fourth buffer layer 141, the third planarization layer 137, and the sixth passivation layer 136, an eighth passivation layer 146 at least partially covering the seventh passivation layer 145, a 4-2$^{th}$ connection line CL4-2 connected to the fourth node n4 through a 4-2$^{th}$ contact hole CH4-2 formed in the eighth passivation layer 146, the seventh passivation layer 145, the fourth gate insulation layer 143, and the fourth buffer layer 141, and the third planarization layer 137, and a fourth planarization layer 147 at least partially covering the 4-2$^{th}$ connection line CL4-2.

First, the fourth buffer layer 141 may be provided on the substrate 10, for preventing the penetration of water or increasing an adhesive force to the fourth semiconductor layer 142.

The fourth buffer layer 141 may include an organic material or an inorganic material and may be formed of at least two layers.

Subsequently, the fourth semiconductor layer 142 may be provided in an area where the second transistor T2 is disposed. The fourth semiconductor layer 142 may include a polysilicon material.

The fourth semiconductor layer 142 according to an embodiment may include a channel area, provided in a region overlapping with a second gate electrode (Gate 2) of the second transistor T2, and a plurality of high-concentration doping areas provided at a portion other than the channel areas. The high-concentration doping areas may be provided at both ends of the channel area.

The channel area may be used as a semiconductor layer of the second transistor T2.

The high-concentration doping areas may include metal properties and may be used as the first terminal or the second terminal of the second transistor T2.

For example, in a cross-sectional surface illustrated in FIG. 17, a channel area corresponding to the second gate electrode (Gate 2) and only the high-concentration doping area connected to the channel area is illustrated.

Subsequently, the fourth gate insulation layer 143 may be formed all over the substrate 10 to cover the fourth semiconductor layer 142. The fourth gate insulation layer 143 according to an embodiment may include SiOx, SiNx, or a multilayer thereof.

Subsequently, the fourth gate electrode layer 144 may be provided on the fourth gate insulation layer 143. The fourth gate electrode layer 144 may be connected to the emission control line ECL. The fourth gate electrode layer 144 may include the second gate electrode (Gate 2).

The fourth gate electrode layer 144 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the seventh passivation layer 145 may be formed all over the substrate 10 to cover the fourth gate electrode layer 144. The seventh passivation layer 145 may include SiOx, SiNx, or a multilayer thereof.

Subsequently, the 2-3$^{th}$ connection line CL2-3 may be connected to the second node n2 through the 2-3$^{th}$ contact hole CH2-3 formed in the seventh passivation layer 145, the fourth gate insulation layer 143, the fourth buffer layer 141, the third planarization layer 137, and the sixth passivation layer 136.

The 2-3$^{th}$ connection line CL2-3 may be connected to the first terminal of the second transistor T2 included in the fourth pixel circuit layer 140.

That is, the second terminal of the driving transistor Tdr included in the first pixel circuit layer 110, the second terminal of the fourth transistor T4 included in the second pixel circuit layer 120, and the first terminal of the second transistor T2 included in the fourth pixel circuit layer 140 may be connected to one another by the 2-1$^{th}$ connection line CL2-1 and the 2-2$^{th}$ connection line CL2-2.

A node, connected to the second terminal of the driving transistor Tdr, the second terminal of the fourth transistor T4, and the first terminal of the second transistor T2, may be the second node n2.

Subsequently, the eighth passivation layer 146 may be formed all over the substrate 10 to cover the 2-3$^{th}$ connection line CL2-3. The eighth passivation layer 146 may include SiOx, SiNx, or a multilayer thereof.

Subsequently, the 4-2$^{th}$ connection line CL4-2 may be connected to the fourth node n4 through the 4-2$^{th}$ contact hole CH4-2 formed in the eighth passivation layer 146, the seventh passivation layer 145, the fourth gate insulation layer 143, and the fourth buffer layer 141.

The 4-2th connection line CL4-2 may be connected to the 4-1$^{th}$ connection line CL4-1 included in the third pixel circuit layer 130, and the 4-1$^{th}$ connection line CL4-1 may be connected to the second terminal of the fifth transistor T5.

Moreover, the 4-2$^{th}$ connection line CL4-2 may be connected to a pixel driving electrode AE (an anode electrode) included in the light emitting device layer 170.

That is, the second terminal of the fifth transistor T5 included in the third pixel circuit layer 130, the second terminal of the second transistor T2 included in the fourth pixel circuit layer 140, and the pixel driving electrode AE (an anode electrode) included in the light emitting device layer 170 may be connected to one another by the 4-2$^{th}$ connection line CL4-2 and the 4-1$^{th}$ connection line CL4-1.

A node, connected to the second terminal of the fifth transistor T5, the second terminal of the second transistor T2, and the pixel driving electrode AE (an anode electrode) included in the light emitting device layer 170, may be the fourth node n4.

Finally, the fourth planarization layer 147 may be formed all over the substrate 10 to cover the 4-2$^{th}$ connection line CL4-2. The fourth planarization layer 147 may include SiOx, SiNx, or a multilayer thereof.

The planarization layer 160 described above with reference to FIG. 3 may be provided on the fourth planarization layer 147, or the fourth planarization layer 147 may perform a function of the planarization layer 160.

Features of the present disclosure described above will be briefly described below.

In the present disclosure, seven transistors and one capacitor may be divisionally disposed at four layers, and circuits provided in the four layers may be connected to one another by contact holes included in the four layers.

In this case, since a planarization layer is provided on a top surface of each layer, each layer may be divided by the planarization layer. The planarization layer may include an organic material or an inorganic material, or may be formed by a combination of an organic material and an inorganic material.

The same lines divisionally provided in a plurality of layers may be connected to one another at an outer portion of a pixel.

In this case, in each of the second pixel circuit layer 120, the third pixel circuit layer 130, and the fourth pixel circuit layer 140, a plurality of scan control lines for transferring scan control signals may be formed to overlap with a semiconductor layer, for preventing a semiconductor layer included in each layer from being affected by signals transferred from a layer thereunder.

That is, a semiconductor layer configuring a transistor included in each of the second pixel circuit layer 120, the third pixel circuit layer 130, and the fourth pixel circuit layer 140 may be formed to overlap with a plurality of scan control lines included in each of the second pixel circuit layer 120, the third pixel circuit layer 130, and the fourth pixel circuit layer 140.

In order to secure an area where a circuit is provided, the number of gate lines in the first pixel circuit layer 110 including the driving transistor Tdr may be minimized. That is, the first pixel circuit layer 110 may include only the $n^{th}$ scan control line SCL(n).

The fifth transistor T5 and the sixth transistor T6 connected to the initialization voltage line Vini may be disposed on the same layer, and thus, the use of a space may increase and the capacitor C may be included in the third pixel circuit layer 130.

Since the fourth node n4 should be connected to the anode electrode of the light emitting device ED, the fourth node n4 may be included in an uppermost layer (i.e., the fourth pixel circuit layer 140) along with the second transistor T2.

In order to prevent the driving transistor Tdr from being affected by the capacitor C, the driving transistor Tdr and the capacitor C may be maximally apart from each other. That is, in the present disclosure, the driving transistor Tdr may be included in the first pixel circuit layer 110, and the capacitor C may be included in the third pixel circuit layer 130.

To provide an additional description, since the driving transistor Tdr occupies a wider area than that of each of other transistors and the capacitor C is preferable to have a large area, the driving transistor Tdr and the capacitor C may be disposed on different layers, and thus, an area of each of the driving transistor Tdr and the capacitor C may be maximally secured.

In the present disclosure, in order to prevent interference caused by layers provided under each pixel circuit layer, the semiconductor layers 112, 122, 132, and 142 may be provided under the gate electrode layers 114, 124, 134, and 144, in each of the second pixel circuit layer 120, the third pixel circuit layer 130, and the fourth pixel circuit layer 140.

Moreover, according to the present disclosure, in a high-resolution light emitting display apparatus, an internal compensation circuit including seven transistors and one capacitor may be implemented.

In an embodiment of the present disclosure, it is described that all transistors included in the pixel driving circuit PDC are implemented as a P type, but the present disclosure is not limited thereto. Therefore, without departing from the technical feature of the present disclosure where an ultrahigh-resolution pixel is implemented by stacking two circuit layers, the transistors may all be modified into an N type, or some transistors may be modified into an N type.

A light emitting display apparatus, to which the present disclosure is applied, may be applied to portable electronic devices, requiring a high resolution, such as smartphones, mobile communication terminals, mobile phones, tablet personal computers (PCs), smart watches, watch phones, and wearable devices, appliances such as televisions, notebook computers, monitors, and refrigerators, and various products such as virtual image display apparatuses and head-mounted display apparatuses.

In the light emitting display panel according to the present disclosure, a plurality of transistors configuring a pixel driving circuit may be divisionally disposed at four layers. Therefore, even in a case where a size of each pixel is reduced by realizing a high resolution, a pixel driving circuit may be sufficiently disposed in each pixel, thereby implementing a high-resolution light emitting display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display panel, comprising: a plurality of pixels, wherein each of the plurality of pixels includes: a first pixel circuit layer including a first pixel circuit configuring a pixel driving circuit; a second pixel circuit layer provided on the first pixel circuit layer, the second pixel circuit layer including a second pixel circuit configuring the pixel driving circuit; a third pixel circuit layer provided on the second pixel circuit layer, the third pixel circuit layer including a third pixel circuit configuring the pixel driving circuit; a fourth pixel circuit layer provided on the third pixel circuit layer, the fourth pixel circuit layer including a fourth pixel circuit configuring the pixel driving circuit; and a light emitting diode layer provided on the fourth pixel circuit layer, the light emitting diode layer including a light emitting diode electrically connected to the fourth pixel circuit; a driving transistor for controlling the amount of current flowing to the light emitting diode, wherein the driving transistor is included in the first pixel circuit layer, and a capacitor for storing a threshold voltage of the driving transistor, wherein the capacitor is included in the third pixel circuit layer.

2. The light emitting display panel of claim 1, wherein:
a first terminal of the driving transistor included in the first pixel circuit layer is connected to a first transistor included in the second pixel circuit layer through a first connection line,
a second terminal of the driving transistor is connected to, through a 2-1$^{th}$ connection line, a second terminal of a fourth transistor included in the second pixel circuit layer, and
a gate of the driving transistor is connected to a first terminal of the fourth transistor through a 3-1$^{th}$ connection line.

3. The light emitting display panel of claim 2, wherein:
the first terminal of the fourth transistor is connected to, through a 3-2$^{th}$ connection line, a second terminal of a sixth transistor included in the third pixel circuit layer, and
the second terminal of the fourth transistor is connected to, through a 2-2$^{th}$ connection line and a 2-3$^{th}$ connection line, a first terminal of a second transistor included in the fourth pixel circuit layer.

4. The light emitting display panel of claim 3, wherein the 3-2$^{th}$ connection line is connected to the 3-1$^{th}$ connection line.

5. The light emitting display panel of claim 3, wherein the 2-2th connection line is connected to the 2-1$^{th}$ connection line and the 2-3$^{th}$ connection line.

6. The light emitting display panel of claim 3, wherein the third pixel circuit layer comprises a fifth transistor including a first terminal, connected to a first terminal of the sixth transistor, and a second terminal connected to, through a 4-1$^{th}$ connection line, the second terminal of the second transistor included in the fourth pixel circuit layer.

7. The light emitting display panel of claim 1, wherein the first pixel circuit comprises:
a third transistor including a gate connected to an n$^{th}$ scan control line and a first terminal connected to a data line; and
the driving transistor including a first terminal connected to the second terminal of the third transistor.

8. The light emitting display panel of claim 7, wherein the second pixel circuit comprises:
a first transistor including a first terminal connected to a pixel driving voltage line, a second terminal connected to the second terminal of the third transistor, and a gate connected to an emission control line; and
a fourth transistor including a gate connected to the n$^{th}$ scan control line, a first terminal connected to the gate of the driving transistor, and a second terminal connected to the second terminal of the driving transistor.

9. The light emitting display panel of claim 8, wherein the third pixel circuit comprises:
a sixth transistor including a first terminal connected to an initialization voltage line, a second terminal connected to the gate of the driving transistor, and a gate connected to an n−1$^{th}$ scan control line;
a fifth transistor including a gate connected to the n$^{th}$ scan control line and a first terminal connected to the initialization voltage line; and a capacitor including a first electrode connected to the second terminal of the sixth transistor and a second electrode connected to the pixel driving voltage line.

10. The light emitting display panel of claim 9, wherein the fourth pixel circuit comprises a second transistor including a gate connected to the emission control line, a first terminal connected to the second terminal of the driving transistor, and a second terminal connected to the light emitting diode.

11. The light emitting display panel of claim 1, wherein a semiconductor layer, configuring a transistor included in each of the second pixel circuit layer, the third pixel circuit layer, and the fourth pixel circuit layer, is formed to overlap with a plurality of scan control lines included in each of the second pixel circuit layer, the third pixel circuit layer, and the fourth pixel circuit layer.

12. A display device, comprising: a display panel including a plurality of pixels, wherein each of the plurality of pixels includes: a first pixel circuit layer including a first pixel circuit configuring a pixel driving circuit; a second pixel circuit layer provided on the first pixel circuit layer, the second pixel circuit layer including a second pixel circuit configuring the pixel driving circuit; a third pixel circuit layer provided on the second pixel circuit layer, the third pixel circuit layer including a third pixel circuit configuring the pixel driving circuit; a fourth pixel circuit layer provided on the third pixel circuit layer, the fourth pixel circuit layer including a fourth pixel circuit configuring the pixel driving circuit; and a light emitting diode layer provided on the fourth pixel circuit layer, the light emitting diode layer including a light emitting diode electrically connected to the fourth pixel circuit; a driving transistor for controlling the amount of current flowing to the light emitting diode, wherein the driving transistor is included in the first pixel circuit layer, and a capacitor for storing a threshold voltage of the driving transistor, wherein the capacitor is included in the third pixel circuit layer.

13. The display device of claim 12, wherein:
a first terminal of the driving transistor included in the first pixel circuit layer is connected to a first transistor included in the second pixel circuit layer through a first connection line;
a second terminal of the driving transistor is connected to, through a second connection line, a second terminal of a fourth transistor included in the second pixel circuit layer; and
a gate of the driving transistor is connected to a first terminal of the fourth transistor through a third connection line.

14. The display device of claim 13, wherein:
the first terminal of the fourth transistor is connected to, through a fifth connection line, a second terminal of a sixth transistor included in the third pixel circuit layer; and
the second terminal of the fourth transistor is connected to, through a sixth connection line and a seventh connection line, a first terminal of a second transistor included in the fourth pixel circuit layer.

15. The display device of claim 14, wherein the fifth connection line is connected to the third connection line.

16. The display device of claim 14, wherein the sixth connection line is connected to the second connection line and the seventh connection line.

17. The display device of claim 14, wherein the third pixel circuit layer comprises a fifth transistor including a first terminal, connected to a first terminal of the sixth transistor, and a second terminal connected to, through an eighth connection line, the second terminal of the second transistor included in the fourth pixel circuit layer.

18. The display device of claim 12, wherein the first pixel circuit includes:

a third transistor including a gate connected to an $n^{th}$ scan control line and a first terminal connected to a data line; and the driving transistor including a first terminal connected to the second terminal of the third transistor, wherein the second pixel circuit includes:

a first transistor including a first terminal connected to a pixel driving voltage line, a second terminal connected to the second terminal of the third transistor, and a gate connected to an emission control line; and a fourth transistor including a gate connected to the $n^{th}$ scan control line, a first terminal connected to the gate of the driving transistor, and a second terminal connected to the second terminal of the driving transistor.

19. The display device of claim 18, wherein the third pixel circuit comprises:

a sixth transistor including a first terminal connected to an initialization voltage line, a second terminal connected to the gate of the driving transistor, and a gate connected to an n-$1^{th}$ scan control line;

a fifth transistor including a gate connected to the $n^{th}$ scan control line and a first terminal connected to the initialization voltage line; and a capacitor including a first electrode connected to the second terminal of the sixth transistor and a second electrode connected to the pixel driving voltage line.

20. The display device of claim 19, wherein the fourth pixel circuit comprises a second transistor including a gate connected to the emission control line, a first terminal connected to the second terminal of the driving transistor, and a second terminal connected to the light emitting diode.

* * * * *